US008988078B2

(12) United States Patent
Kiuchi

(10) Patent No.: US 8,988,078 B2
(45) Date of Patent: Mar. 24, 2015

(54) VOLTAGE MONITORING SYSTEM AND VOLTAGE MONITORING MODULE

(75) Inventor: Hideki Kiuchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 474 days.

(21) Appl. No.: 13/481,849

(22) Filed: May 27, 2012

(65) Prior Publication Data

US 2012/0306506 A1    Dec. 6, 2012

(30) Foreign Application Priority Data

May 31, 2011    (JP) .................................. 2011-122094

(51) Int. Cl.
  *G01N 27/416*    (2006.01)
  *G01R 31/36*    (2006.01)
  *H01M 10/48*    (2006.01)
  *H02J 7/00*    (2006.01)

(52) U.S. Cl.
  CPC ........... *G01R 31/3658* (2013.01); *H01M 10/48* (2013.01); *H01M 10/482* (2013.01); *H02J 7/0021* (2013.01); *H02J 7/0013* (2013.01); *Y02T 10/7055* (2013.01)
  USPC .......................................... 324/434; 320/127

(58) Field of Classification Search
  CPC ..................... G01R 31/3658; G01R 19/16542; G01R 31/3648; H02J 7/0021; Y02E 60/12
  See application file for complete search history.

(56) References Cited

U.S. PATENT DOCUMENTS

| | | | | |
|---|---|---|---|---|
| 2001/0052759 | A1* | 12/2001 | Sakurai et al. | 320/134 |
| 2003/0086229 | A1* | 5/2003 | Poe et al. | 361/93.1 |
| 2007/0096697 | A1* | 5/2007 | Maireanu | 320/149 |
| 2008/0164881 | A1* | 7/2008 | Miyamoto | 324/429 |

FOREIGN PATENT DOCUMENTS

JP        2010-081692 A    4/2010

* cited by examiner

*Primary Examiner* — Arun Williams
(74) *Attorney, Agent, or Firm* — Miles & Stockbridge P.C.

(57) ABSTRACT

In a voltage monitoring system, a voltage monitoring module includes an adjusting current control circuit to generate an adjusting current so that the operating current consumed by the voltage monitoring modules reaches a specified value corresponding to a first operation current setting command, and stops generating the adjusting current according to an operating current switching command; and an operating current measurement circuit to measure the operating current according to the operating current measuring command following the operating current switching command; and in which a module control circuit sends a second operation current setting command based on the operating current that was measured, and the adjusting current control circuit generates an adjusting current so that the operating current reaches a specified value corresponding to the second operating current setting command.

23 Claims, 17 Drawing Sheets

|       | INITIALIZING MODE I_total | NORMAL OPERATING MODE I_total |
|-------|---------------------------|-------------------------------|
| VMM1  | 4.5 mA                    | 5 mA                          |
| VMM2  | 0.8 mA                    | 5 mA                          |
| VMM3  | 0.9 mA                    | 5 mA                          |
| ⋮     | ⋮                         | ⋮                             |
| VMMn  | 2.5 mA                    | 5 mA                          |

FIG. 13

|  | SLEEP MODE I_total | LOAD CURRENT IN LOAD CIRCUIT | CONSUMPTION CURRENT IN ADJUSTER CURRENT CONTROL CIRCUIT |
|---|---|---|---|
| VMM1 | 30 uA | 25 uA | 5 uA |
| VMM2 | 30 uA | 25 uA | 5 uA |
| VMM3 | 30 uA | 25 uA | 5 uA |
| ⋮ | ⋮ | ⋮ | ⋮ |
| VMMn | 30 uA | 25 uA | 5 uA |

VOLTAGE MONITORING SYSTEM AND VOLTAGE MONITORING MODULE

CROSS-REFERENCE TO RELATED APPLICATIONS

The disclosure of Japanese Patent Application No. 2011-122094 filed on May 31, 2011 including the specifications, drawings and abstract is incorporated herein by reference in its entirety.

BACKGROUND

The present invention relates to a voltage monitoring system and voltage monitoring module and relates in particular to a voltage monitoring system and voltage monitoring module to monitor the voltage of cells in a battery pack utilizing multiple cells coupled in series as one battery cell.

In recent years, battery cells that supply electrical power to the motors such as in automobiles often use battery packs that are multiple cells coupled in series as one battery cell. An equal voltage must be maintained in the cells in order to maintain performance in this battery pack. Numerous voltage monitoring systems have therefore been proposed for monitoring the voltage in each of the battery cells that form the battery pack.

In the voltage monitoring systems, one voltage monitoring module is installed for multiple battery cells, and multiple voltage monitoring modules monitor the voltage of all cells in the battery pack. The voltage monitoring modules operate at this time from power supplied from the battery cell group for monitoring. Therefore, when a difference in electrical current consumption occurs among the voltage monitoring modules in the voltage monitoring system, then a difference in battery cell electrical current consumption speed occurs between a battery cell group monitored by one voltage monitoring module, and the battery cell groups monitored by the other voltage monitoring modules. This difference in electrical current consumption speeds causes a difference in voltage among the battery cells, creating the problem of a drop in battery pack performance.

Japanese Unexamined Patent Application Publication No. 2010-81692 therefore discloses a technology for equalizing the current consumption in multiple voltage monitoring modules. Japanese Unexamined Patent Application Publication No. 2010-81692 is technology relating to a vehicular power supply monitoring device. FIG. 17 shows a block diagram of the vehicular power supply device disclosed in Japanese Unexamined Patent Application Publication No. 2010-81692. The vehicular power supply device shown in FIG. 17 includes a drive battery 101 including multiple battery cells 103 coupled in series to supply electrical power to the motor driving the vehicle; and multiple sensing circuits 105 to isolate the drive battery 101 into multiple cell blocks 102 and detect the state in each of the separate cell blocks 102. Each of these sensing circuits 105 operates from power supplied from each of the cell blocks 102. Moreover, an equalizing circuit 110 for equalizing each of the cell block 102 load currents to a specified current value is coupled to each of the sensing circuits 105. This equalizing circuit 110 equalizes the load current in each of the cell blocks 102 per the operating state of each sensing circuit 105.

FIG. 18 shows a block diagram of the equalizing circuit 110 disclosed in Japanese Unexamined Patent Application Publication No. 2010-81692. The equalizing circuit 110 in FIG. 18 increases or decreases the balance current flowing in the balance current adjusting circuit 113 according to the increase or decrease in the voltage differential occurring across both ends of the current detector resistor 112 according to the electrical current (consumption current) flowing in the current detector resistor 112. More specifically, the balance current adjusting circuit 113 increases or decreases the balance current flowing in the output transistor 117 based on the voltage differential between the reference voltage 115 and the amplified voltage output from the differential amplifier 114 amplifying the voltage differential occurring across both ends of the current detector resistor 112. The balance current at this time lowers if the voltage differential across both ends of the current detector resistor 112 increased, and rises if the voltage differential across both ends of the current detector resistor 112 has decreased. The size of the balance current can be set by varying the reference voltage 115. The current setting adjusting circuit 120 varies the voltage value of the reference voltage 115.

The vehicular power supply device disclosed in Japanese Unexamined Patent Application Publication No. 2010-81692 in other words equalizes the consumption current among the sensing circuits 105 by setting the reference voltage 115 so that the consumption current flowing in each of the sensing circuits 105 is the same or larger than the largest consumption, current among the consumption current flowing among the sensing circuits 105.

SUMMARY

Electrical current consumption in the battery cell monitoring modules must be lowered in order to limit current consumption in the battery pack cells. Normally there is no need to constantly monitor the voltages in the battery cells since intermittent voltage monitoring is sufficient. One method to reduce the electrical current consumption is to apply the sleep mode to stop voltage monitoring operation of the battery cell by the voltage monitoring module. The load current in the cells therefore changes according to whether the battery cell monitoring module is operating either in normal mode for voltage monitoring operation or for sleep mode to stop voltage monitoring operation. Moreover, the load current in the battery cell will change each moment according to the vehicle drive state, even if operating in the same monitoring mode.

Since the load current in the battery cell fluctuates in this way according to the operating mode and the vehicle drive state, extending the life of the cells in the battery pack requires resetting the current consumption values of the voltage monitoring module to an ideal value, according to the fluctuations in the operating mode and the vehicle drive state.

However, an optimal value cannot be set in the power supply device disclosed in Japanese Unexamined Patent Application Publication No. 2010-81692 when resetting current consumption values that are jointly used by all the voltage monitoring modules. Setting an optimal value is impossible because the common current consumption value for all monitoring modules is set based on each measured value found from measuring the current consumed by each monitoring module but this measured value includes a balance current portion for equalizing the consumption current and so this value does not reflect the actual current consumed in each monitoring module. In other words, the power supply device disclosed in Japanese Unexamined Patent Application Publication No. 2010-81692 is not able to set an optimal value when resetting the common current consumption value for all voltage modules. This method cannot therefore reset an ideal current consumption value according to fluctuations in the operating mode or vehicle drive state. Moreover, since the technology in Japanese Unexamined Patent Application Publication No. 2010-81692 cannot reset each IC's current consumption value, the discharge characteristic in each battery cell will remain different because there is no optimal value for equalization, causing the problem of a drop in the life of the battery pack.

According to one aspect of the present invention, a voltage monitoring system is a system for monitoring multiple battery cells mutually coupled in series and includes a voltage monitoring module for operating on a voltage received from at least one battery cell among multiple battery cells and monitoring the battery cells, and a module control circuit for controlling the voltage monitoring module; and the voltage monitoring module includes an adjusting current control circuit that generates an adjusting current in response to a first operating current setting command sent from the module control circuit so that an operating current consumed by the voltage monitoring module reaches a specified value corresponding to the first operating current setting command and stops generating of the adjusting current in response to an operating current switching command sent from the module control circuit; and an operating current measurement circuit that measures the operating current in response to an operating current measuring command sent following the operating current switching command from the module control circuit, in which the module control circuit sends a second operating current setting command based on the measured operating current, and the adjusting current control circuit generates an adjusting current in response to the second operating current setting command so that the operating current reaches a specified value corresponding to the second operating current setting command.

According to another aspect of the present invention, a voltage monitoring module operates on a voltage received from at least one battery cell among multiple battery cells mutually coupled in series and monitors the battery cells, and includes an adjusting current control circuit that generates an adjusting current in response to a first operating current setting command sent from the external section so that an operating current consumed by the voltage monitoring module reaches a specified value corresponding to the first operating current setting command and stops generating of the adjusting current according to an operating current switching command sent from an external section; and an operating current measurement circuit that measures the operating current according to the operating current measuring command sent following the operating current switching command from an external section; and the adjusting current control circuit generates an adjusting current in response to a second operating current setting command that was generated based on the measured operating current so that the operating current reaches a specified value corresponding to the second operating current setting command.

According to the aspects of the present invention, the voltage monitoring system and voltage monitoring module stops the adjusting current generated in the adjusting current control circuit and measures the operating current according to an operating current measuring command sent following the operating current switching command. The adjusting current control circuit then generates an adjusting current in response to a second operating current setting command generated based on the measured operating current so as to attain a specified value corresponding to the second operating current setting command. In other words, the voltage monitoring system and voltage monitoring module according to the present invention is capable of rewriting or updating the size of the adjusting current to match the state of the voltage monitoring module.

According to the aspects of the present invention, the voltage monitoring system and voltage monitoring module is capable of rewriting the consumption current of the voltage monitoring module to match the state of the voltage monitoring module.

BRIEF DESCRIPTION OF THE DRAWINGS

FIG. 13 is a table for describing the operating current during sleep mode in the voltage monitoring module of the voltage monitoring system of the first embodiment;

DETAILED DESCRIPTION

First Embodiment

Figure 1:
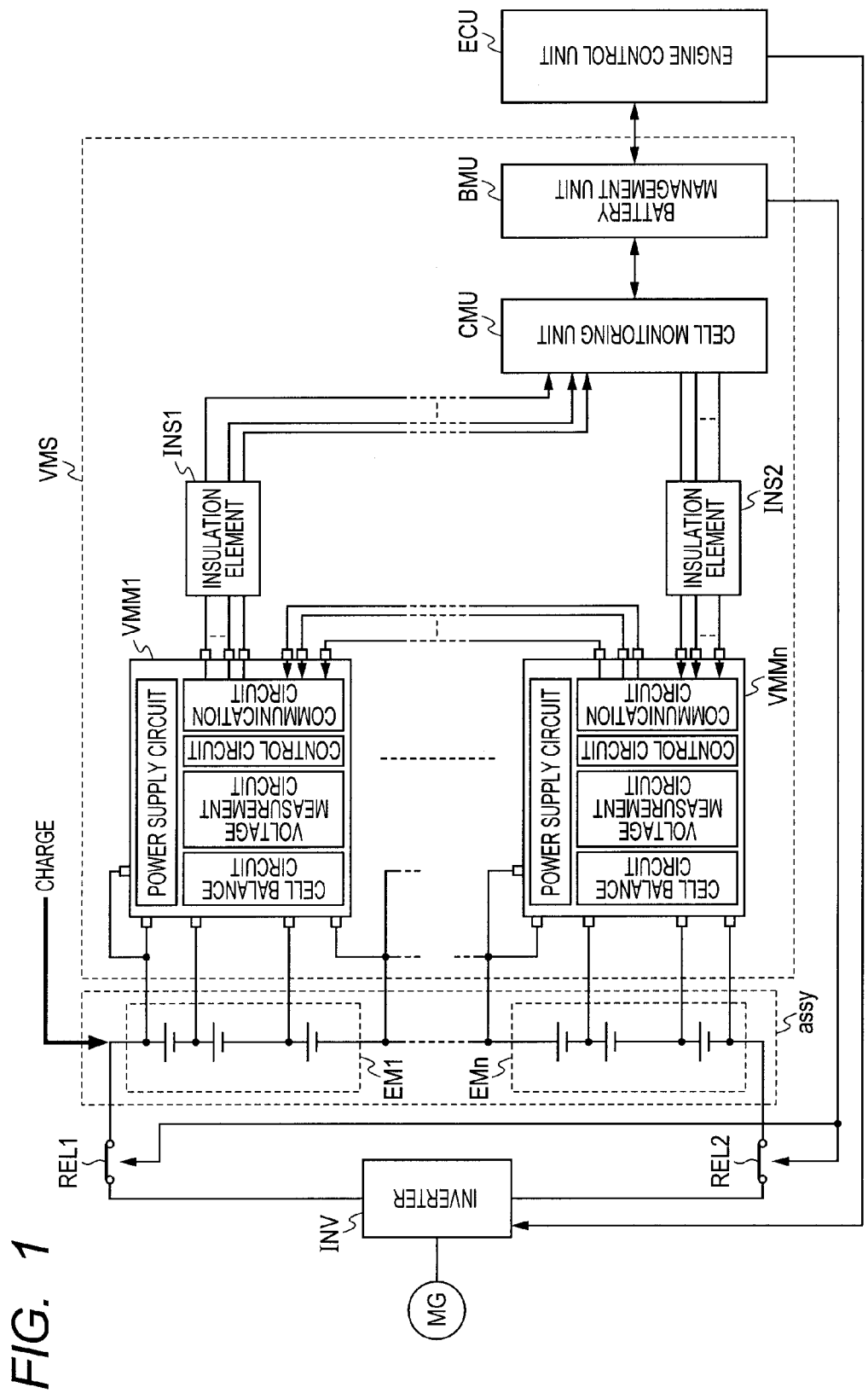
FIG. 1 is a block diagram of the motor drive device including the voltage monitoring system of the present invention.

The embodiments of the present invention are described next while referring to the drawings. In the drawings, the same reference numerals are attached to the same element, and redundant sections are omitted where not required.

The voltage monitoring system for monitoring the output voltage of the battery pack supplying power for example to an electric vehicle is described next assuming an understanding of the embodiment of the present invention is required. An overview of the voltage monitoring system VMS for monitoring the output voltage of the battery pack supplying power for example to an electric vehicle is first of all described while referring to FIG. 1. FIG. 1 is a block diagram showing the structure of the voltage monitoring system VMS for monitoring the output voltage of the battery pack supplying power to an electric vehicle, etc. The voltage monitoring system VMS includes the voltage monitoring modules VMM1 through VMMn (n is an integer of 2 or more), an insulation element INS1 and INS2, a cell monitoring unit CMU, and a battery management unit BMU. The cell monitoring unit CMU and the battery management unit BMU are comprised for example from a microcomputer (hereafter, MCU: Micro Computing Unit).

The voltage monitoring system VMS monitors the voltage of the battery pack assembly by way of the voltage monitoring modules VMM1-VMMn. The battery pack assembly includes n number of the cell modules EM1-EMn coupled in series. Each of the cell modules EM1-EMn includes m number of serially coupled battery cells (m is an integer of 2 or more). The battery pack assembly is in other words, (m×n) number of serially coupled battery cells. The battery pack assembly can in this way achieve a high output voltage.

The cell monitoring unit CMU is coupled by way of the insulation element INS2 to the communication input terminal of the voltage monitoring modules VMMn, and coupled by way of the insulation element INS1 to the communication output terminal of the voltage monitoring module VMM1. Components such as photocouplers are utilized as the insulation elements INS1 and INS2, and electrically isolate the voltage monitoring modules VMM1-VMMn from the cell monitoring unit CMU. The cell monitoring unit CMU can in this way be protected from damage in the event of a breakdown or similar problem from high voltage applied from the battery pack assembly to the cell monitoring unit CMU.

The cell monitoring unit CMU is further coupled to the battery management unit BMU. The cell monitoring unit CMU calculates the output voltage of each battery cell from the voltage monitoring results from the voltage monitoring modules VMM1 through VMMn and reports these results to the battery management unit BMU. The cell monitoring unit CMU also controls the operation of voltage monitoring modules VMM1-VMMn according to commands from the battery management unit BMU. The battery management unit BMU is further coupled to the engine control unit (ECU). The battery management unit BMU controls the voltage monitoring system VMS operation according to commands from the engine control unit ECU and the output voltage from each battery cell reported from the cell monitor unit. The battery management unit BMU notifies the engine control unit ECU of information such as relating to the status of the battery pack assembly and the voltage monitoring system VMS. The operation of the cell monitoring unit CMU and the battery management unit BMU is described in detail in the voltage monitoring system VMS described later on.

Figure 2:
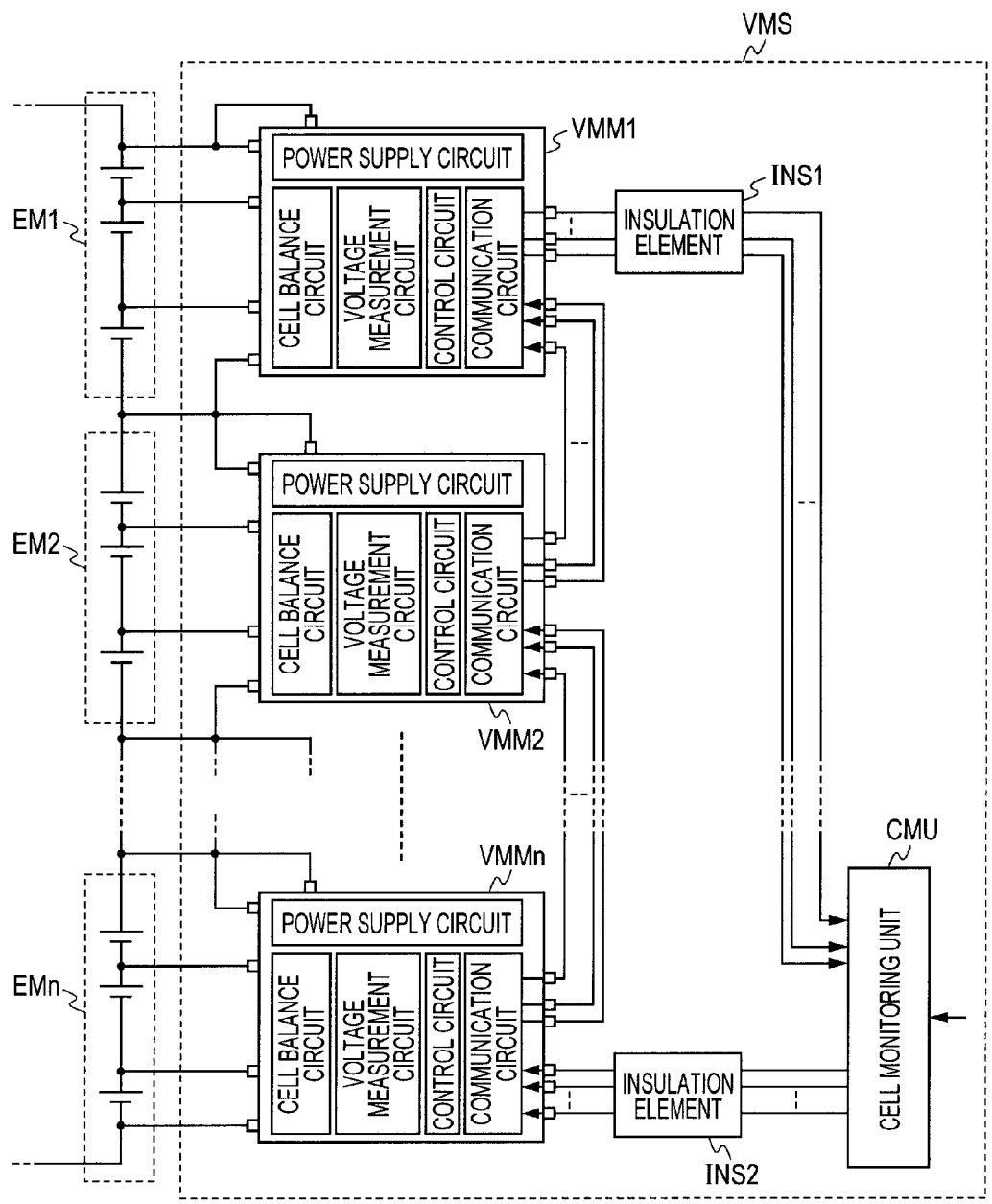
FIG. 2 is a block diagram of the voltage monitoring system of the present invention.

The coupling between the voltage monitoring modules VMM1-VMMn and the cell monitoring unit CMU is described next while referring to FIG. 2. Here, FIG. 2 is a block diagram of an essential section of the voltage monitoring system VMS showing the connection relation between the voltage monitoring modules VMM1-VMMn and the cell monitoring unit CMU. The voltage monitoring modules VMM1-VMMn are coupled to the respective cell modules EM1-EMn, and monitor the voltages received from the cell modules EM1-EMn. The voltage monitoring modules VMM1-VMMn are in a daisy chain configuration, and the output from the communication circuit for the voltage monitoring modules VMM2-VMMn is coupled to the respective communication circuit input of the voltage monitoring modules VMM1-VMM (n−1).

The cell monitoring unit CMU outputs a control signal by way of the insulation element INS2 to the voltage monitoring modules VMMn. The control signals for the voltage monitoring modules VMM1-VMM (n−1) are conveyed by utilizing a daisy chain configuration to the voltage monitoring modules VMM1-VMMn (n−1). The cell monitoring unit CMU in this way controls the operation of the voltage monitoring modules VMM1-VMMn. The voltage monitoring modules VMM1-VMMn output the monitoring results by way of the insulation element INS1 to the cell monitoring unit CMU according to control signals received from the cell monitoring unit CMU. The monitoring results from the voltage monitoring modules VMM2-VMMn are conveyed to the cell monitoring unit CMU by utilizing a daisy chain configuration.

Figure 3:
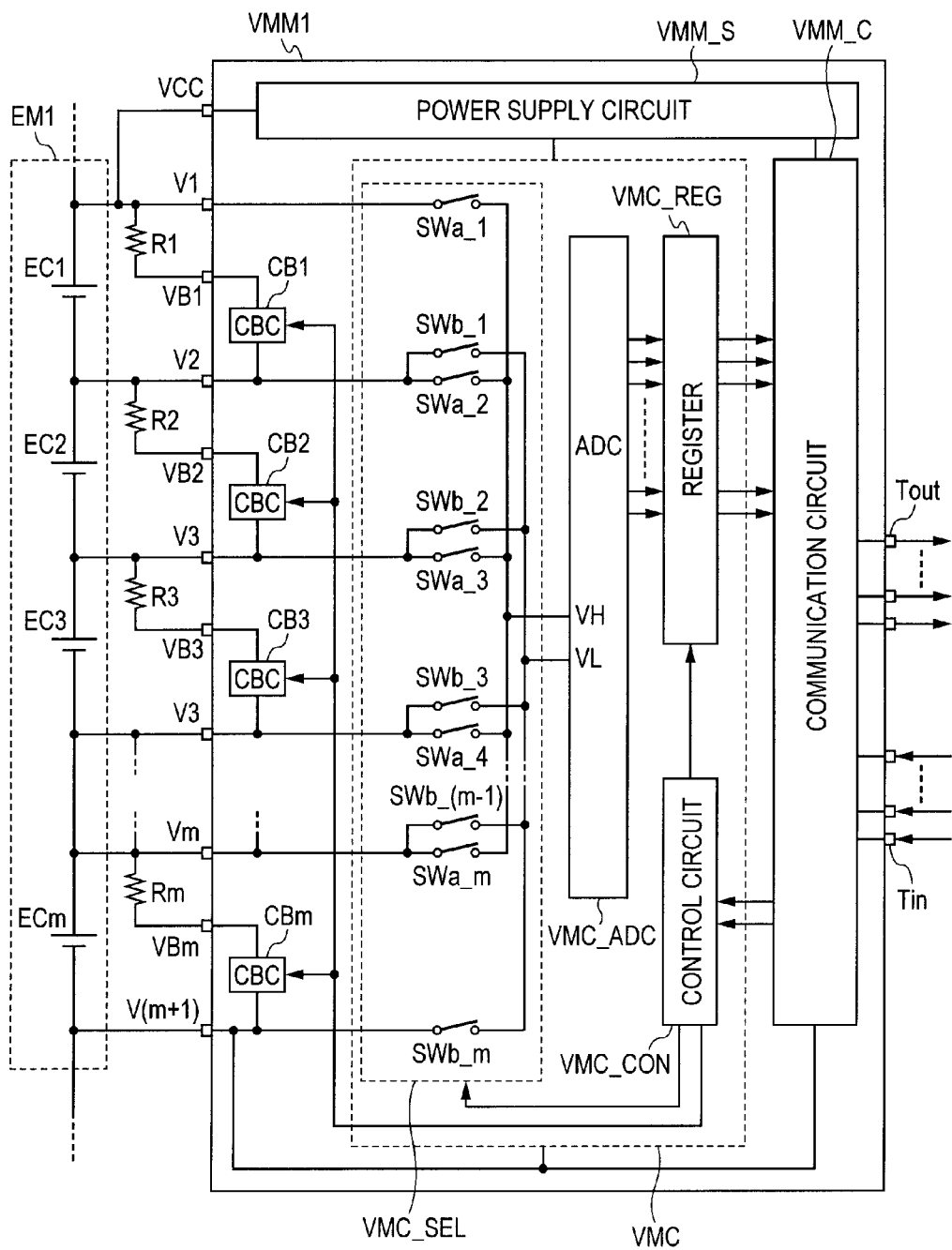
FIG. 3 is a block diagram of the voltage monitoring module of the present invention.

The respective configurations of each of the voltage monitoring modules VMM1-VMMn are described next. The voltage monitoring modules VMM1-VMMn each possess the same configuration. The configuration of the voltage monitoring modules VMM1 is described as a typical example while referring to FIG. 3. FIG. 3 is a block diagram showing the configuration of the voltage monitoring module VMM1. The voltage monitoring module VMM1 includes a power supply circuit VMM_S, a communication circuit VMM_C, a voltage measurement circuit VMC, a cell balance circuits CB1-CBm (m is an integer of 2 or more), the power supply terminal VCC, the input terminals V1-V (m+1), the cell balance input terminals VB1-VBm, communication input terminal Tin and the communication output terminal Tout.

In the cell module EM1, the battery cells EC1-ECm are serially connected in order from the high voltage side. In the voltage monitoring module VMM1, the power supply terminal is coupled to the high voltage side of the battery cell EC1. The low voltage side of the battery cell ECm is coupled to the input terminal V (m+1). Voltage at the input terminal branches within the voltage monitoring module VMM1 and is supplied to the voltage measurement circuit VMC and the communication circuit VMM_C as a ground voltage. The output voltage from the cell module EM1 is in this way supplied as a power supply voltage to the voltage monitoring module VMM1. The power supply circuit VMM_S receives power by way of the power supply terminal VCC from the battery cell EC1. The power supply circuit VMM_S supplies power to the communication circuit VMM_C and the voltage measurement circuit VMC.

The voltage measurement circuit VMC includes a selector circuit VMC_SEL, A/D converter (Analog to Digital Converter: ADC) VMC_ADC, register VMC_REG and control circuit VMC_CON. The selector circuit VMC_SEL includes the switch SWa_1 through SWa_m and SWb_1 through SWb_m. The switches SWa_1 through SWa_m and SWb_1 through SWb_m are turned on and off by control signal from the control circuit VMC_CON. Here, the switches SWa_j and SWb_j turn on simultaneously, when j is set as an integer from 1 through m and when measuring the voltage of the battery cell ECj. The voltage from the high voltage side terminal of battery cell ECj is in this way supplied by way of the input terminal Vj, as the high voltage side voltage VH to the A/D converter VMC_ADC. The voltage from the low voltage side terminal of battery cell ECj is in the same way supplied by way of the input terminal V (j+1) as the low voltage side voltage VL to the A/D converter VMC_ADC.

The A/D converter VMC_ADC converts the high voltage side voltage VH and the low voltage side voltage VL to digital values serving as the voltage values. The A/D converter VMC_ADC then outputs those voltage values serving as the digital values to the register VMC_REG. The register VMC_REG stores the voltage values output from the A/D converter VMC_ADC. The control circuit repeats the operation for sequentially setting the switches SWa_1 through SWa_m and SWb_1 through SWb_m to on state, at each specified time (for example, 10 msec). The control circuit in this way overwrites the voltage values supplied to the input terminal Vj and V(j+1) into the register VMC_REG at each specified time.

The communication circuit VMM_C receives the command from the cell monitoring unit CMU and the outputs from the other voltage monitoring modules VMM2-VMMn by way of the communication input terminal Tin. The communication circuit VMM_C then transfers the command from the cell monitoring unit CMU to the control circuit VMC_CON. The communication circuit VMM_C then transfers the output from the voltage monitoring modules VMM2-VMMn unchanged to the cell monitoring unit CMU.

The cell balance circuit CBj and the externally mounted resistor Rj are externally coupled between the respective input terminals Vj and the input terminals (j+1) by way of the cell balance input terminal VBj. The setting of the cell balance circuit CBj to the on state causes current flow between the input terminal Vj and the input terminal V(j+1). The on and off control of the cell balance circuits CB1-CBm by the control circuit VMC_CON causes selective discharging of the battery cells EC1-ECm.

The operation of the voltage monitoring system VMS is described next while referring to FIG. 1. The battery cell output voltage monitoring operation is first of all described. The voltage monitoring system VMS starts the battery cell output voltage monitoring operation according to the voltage monitoring operation start command from the cell monitoring unit CMU. The engine control unit ECU for example detects the power-on state in the electric vehicle, and issues a voltage monitoring system VMS startup command to the battery management unit BMU. The battery management unit BMU issues a voltage monitoring modules VMM1-VMMn startup command to the cell monitoring unit CMU according to the voltage monitoring system VMS startup command. The cell monitoring unit CMU issues a voltage monitoring operation start command to the voltage monitoring modules VMM1-VMMn according to the voltage monitoring modules VMM1-VMMn.

The operation of the voltage monitoring modules VMM1-VMMn is described while referring to FIG. 3. The voltage monitoring modules VMM1-VMMn that received the voltage monitoring operation start command each perform the same operation so the operation of the voltage monitoring module VMM1 is described hereafter as a representative example. The voltage monitoring module VMM1 starts the voltage monitoring operation according to the voltage monitoring operation start command from the cell monitoring unit CMU. More specifically, the communication circuit VMM_C transfers the voltage monitoring operation start command from the cell monitoring unit CMU to the control circuit VMC_CON of the voltage measurement circuit VMC. The control circuit VMC_CON sets the switches SWa_j and SWb_j to the on state according to the voltage monitoring operation start command. The input terminals Vj and V(j+1) are in this way coupled to the respective A/D converter VMC_ADC. The A/D converter VMC_ADC converts the size of the voltages supplied to the coupled input terminals Vj and V(j+1) to digital values serving as the voltage values, and writes the voltage values into the register VMC_REG.

In this example, the control circuit VMC_CON sequentially sets the switches SWa_1-SWa_m and SWb_1-SWb_m to the on state within a specified time. Namely, the control circuit VMC_CON repeats m number of switching operations within a specified time. The specified amount of time is for example 10 milliseconds. In this case, the voltage monitoring module VMM1 measures the value of the voltages respectively supplied to the input terminals Vj and V(j+1) at each specified time (10 msec) and successively overwrites those measured values into the register VMC_REG. The voltage monitoring module VMM1 continues the above described voltage monitoring operation unless there is a command from the cell monitoring unit CMU.

When search for a battery cell output voltage value for controlling the electric vehicle, the cell monitoring unit CMU issues a voltage output command to the voltage monitoring module VMM1 according to the command received from the battery management unit BMU. The voltage monitoring module VMM1 outputs the voltage value of the specified input terminal to the cell monitoring unit CMU according to the voltage value output command. More specifically, the communication circuit VMM_C transfers the voltage value output command from the cell monitoring unit CMU to the control circuit VMC_CON of the voltage measurement circuit VMC. The control circuit VMC_CON issues an output command to the register VMC_REG according to the voltage value output command. The control circuit VMC_CON in this case specifies which of the input terminal voltage values to output to the register VMC_REG. The register VMC_REG outputs the voltage value of that specified input terminal by way of the communication circuit VMM_C to the cell monitoring unit CMU at the time that the output command is received according to the output command from the control circuit VMC_CON.

The cell monitoring unit CMU calculates the output voltage of the battery cell ECj from the voltage values for the input terminals Vj and V(j+1) received from the voltage monitor module VMM1. The cell monitoring unit CMU can for example calculate the output voltage of the battery cell EC1 from the voltage differential between the input terminal V1 and the input terminal V2. The cell monitoring unit CMU then notifies the battery management unit BMU of the calculated battery cell output voltage according to the request from the battery management unit BMU.

When the electric vehicle is in the power-off state, the engine control unit ECU detects the power-off stage in the electric vehicle and issues a stop command for the voltage monitoring system VMS to the battery management unit BMU. The battery management unit BMU issues a stop command for the voltage monitoring modules VMM1-VMMn to the cell monitoring unit CMU according to the stop command for the voltage monitoring system VMS. The cell monitoring unit CMU issues a voltage monitoring operation stop command to the voltage monitoring modules VMM1-VMMn according to the stop command for the voltage monitoring modules VMM1-VMMn. The voltage monitoring modules VMM1 stops the voltage monitoring operation according to the voltage monitoring operation stop command from the cell monitoring unit CMU. More specifically, the communication circuit VMM_C transfers the voltage monitoring operation stop command from the cell monitoring unit CMU to the control circuit VMC_CON of the voltage measurement circuit VMC. The control circuit VMC_CON sets all the switches SWa_1-SWa_m and SWb_1-SWb_m to the off state according to the voltage monitoring operation stop command. The voltage monitoring operation is stopped in this way.

The voltage monitoring operation of the battery cells was described above. However, the voltage monitoring system VMS is mounted for example in electric vehicles and so must operate under electric vehicle usage conditions. Operation of the voltage monitoring system VMS according to electric vehicle usage conditions is therefore described next.

Continued usage of electric vehicles requires electrically charging the battery pack assembly by an electric charging unit, etc. In order to charge the battery pack assembly, the engine control unit ECU detects an operation by the driver such as coupling the charging plug, and issues a charging command to the battery management unit BMU in order to charge the battery pack assembly. The battery management unit BMU opens the relays REL1 and REL2 according to the charging command from the engine control unit ECU. This operation electrically cuts off the battery pack assembly and the inverter INV. The battery pack assembly is charged in this way by supplying an external charging voltage CHARGE to the battery pack assembly by way of the charging plug, etc.

Overcharging or over discharging of rechargeable batteries such as battery cells is generally known to shorten the battery cell life. Moreover, in structures such as battery pack assemblies where multiple battery cells are coupled in series, variations or irregularities such as during battery cell production cause voltage irregularities to occur even in the same charging and discharging operation. Repeating the charging operation on the battery pack assembly while these irregularities are still occurring causes deterioration just in a particular battery cell and also overcharging and over-discharging to occur. The overcharging and over-discharging therefore shortens the life of the overall battery pack assembly and causes breakdowns to occur. Utilizing serially coupled battery cells therefore requires maintaining a voltage balance (so-called cell balance) in each battery cell.

The battery cell operation in the voltage monitoring system VMS when charging this electric charging unit and so on is described next. Methods for calculating the output voltage of the cell and output voltage monitoring operation of the battery cell are the same as already described and so are omitted here.

First of all, the battery management unit BMU issues an output voltage measuring command to the cell monitoring unit CMU according to the charging command from the engine control unit ECU. The cell monitoring unit CMU calculates the output voltage for all the battery cells in the battery pack assembly according to the output voltage measuring command from the battery management unit BMU and notifies the battery management unit BMU of the calculated output voltages. The battery management unit BMU designates the battery cell with the lowest output voltage within the battery pack assembly. In order to simplify the description here, the battery cell EC1 in the cell module EM1 serves as the battery cell with the lowest output voltage within the battery pack assembly.

The battery management unit BMU then issues a cell balance operating command to the cell monitoring unit CMU. The cell monitoring unit CMU issues a discharge command to the voltage monitoring modules VMM1-VMMn according to the cell balance operating command. The operation of the voltage monitoring module VMM1 is next described as a representative example. In the voltage monitoring module VMM1, the control circuit VMC_CON in the voltage measurement circuit VMC receives a discharge command by way of the communication circuit VMM_C. The control circuit VMC_CON sets the cell balance circuits CB2-CBm to the on state according to the discharge command and in this way discharges the battery cells EC2-ECm.

The cell monitoring unit CMU calculates the output voltages of the battery cells EC2-ECm one after another during discharge. Then if any of the output voltages among the battery cells has dropped to the output voltage of battery cell EC1, then a discharge stop command is issued to stop the discharge operation in the applicable battery cell. The following description is for describing the case where the output voltage of battery cell EC2 was lowered to the output voltage of battery cell EC1 by discharging. First of all, the cell monitoring unit CMU detects a drop in the output voltage of battery cell E2 down to the output voltage of battery cell EC1. The cell monitoring unit CMU then issues a discharge stop command for the battery cell EC2 to the voltage monitor module VMM1.

The control circuit VMC_CON of voltage monitoring module VMM1 receives the discharge stop command for the battery cell EC2 by way of the communication circuit VMM_C. The control circuit VMC_CON sets the cell balance circuit CB2 to the off state according to the discharge stop command for the battery cell EC2. The control circuit VMC_CON in this way stops discharging of the battery cell EC2, and the output voltage of battery cell EC2 attains the same output voltage as the battery cell EC1. The cell monitoring unit CMU performs this same operation to make the output voltage of each cell among the battery cells EC3-ECM of cell module EM1 and cell modules EM2-EMn attain the same output voltage as the battery cell EC1. The output voltage in each battery cell of the cell modules EM2-EMn are in this way made uniform (equalized) and the cell monitoring unit CMU terminates the cell balance operation. The cell monitoring unit CMU notifies the battery management unit BMU that the cell balance operation has ended.

The battery management unit BMU issues a charge start command to the charging section (not shown in drawing) coupled to the charging plug, according to the cell balance operation termination notification. An external charging voltage CHARGE is in this way supplied to the battery pack assembly, and charging of the battery pack assembly begins.

The cell monitoring unit CMU monitors the output voltage of each cell during charging. Then, if any of the battery cell output voltages has reached the charging upper limit voltage, an overcharge warning notice is conveyed to the battery management unit BMU. The battery management unit BMU issues a charge stop command to the charging section according to the overcharge warning notification. The supply of the external charging voltage CHARGE is in this way cut off and the charging stops. The charging, upper limit voltage is preferably set to a voltage smaller than the threshold voltage level during charging, so that charging upper limit voltage will include an ample (safety) margin from the voltage level during overcharging in order to allow reliably preventing an overcharge of the battery cell from occurring.

There are irregularities among the charging characteristics of each battery cell among the cell module EM1-EMn. Consequently irregularities occur in each of the battery cell voltage value after charging. The cell monitoring unit CMU therefore measures the output voltage of each battery cell in order to determine the voltage value irregularities in each battery cell. The cell monitoring unit CMU judges whether the output voltage irregularities from each battery cell are within a specified range. The cell monitoring unit then notifies the battery management unit BMU of the judgment results.

If the output voltage irregularities from each battery cell are not within the specified range then the battery management unit BMU commands the cell monitoring unit CMU to start the cell balance operation. After completion of the cell balance operation, the battery management unit BMU commands that charging start in the charging section. On the other hand, if output voltage irregularities from each battery cell are within the specified range, then the battery management unit BMU notifies the engine control unit ECU that charging is now complete. The engine control unit ECU displays the information that charging of the battery pack assembly was completed on a display device mounted at the driver's seat. By monitoring the battery cell output voltages as described above, the voltage monitoring system VMS can prevent overcharging and also charge the battery pack assembly to a fully charged state while maintaining a satisfactory cell balance.

Making the electric vehicle accelerate is described next. To make the electric vehicle accelerate, the engine control unit ECU detects for example the driver depressing the accelerator pedal and issues an accelerator command to the inverter INV and the battery management unit BMU to make the electric vehicle accelerate. The inverter INV switches the operating mode to direct current-to-alternate current conversion mode according to the accelerator command from the engine control unit ECU. The battery management unit BMU closes the relays REL1 and REL2 according to the accelerator command from the engine control unit ECU. The battery pack assembly in this way supplies a direct current (DC) voltage to the inverter INV. The inverter INV converts the DC voltage to an AC (alternate current) voltage and supplies the AC current to the motor-generator MG. The motor-generator MG generates a driving force by receiving the supplied AC (alternate current) voltage. The driving force generated in the motor-generator MG is conveyed to the (vehicle) drive wheels by the driveshaft or other mechanism to make the electric vehicle accelerate.

Making the electric vehicle accelerate consumes the electric power accumulated in the battery cell and the battery cell output voltage continuously drops. A measure is therefore required to prevent over-discharging the battery cells. The voltage monitoring system VMS therefore continuously monitors the output voltages from the battery cells during driving of the vehicle. In the case for example that any of the battery cell voltages fall below the warning level voltage, then the cell monitoring unit CMU issues a voltage drop warning to the battery management-unit BMU. The battery management unit BMU issues a battery pack assembly low remaining charge warning to the engine control unit ECU. The engine control unit ECU displays the battery pack assembly low remaining charge warning on the display device mounted at the driver's seat to notify the driver that over-discharging might be occurring in the battery cells. The voltage monitoring system VMS can in this way urge the driver to take measures to prevent over-discharging such as by stopping the vehicle, etc.

If the vehicle continues to be driven even after the battery pack assembly low remaining charge warning, then the output voltage from the battery cells will drop even further. So to prevent excessive battery cell discharging, the discharge within each battery cell must therefore be stopped. In case for example that the voltage in any of the battery cells has fallen to the emergency shutdown level then the cell monitoring unit CMU issues an emergency shutdown warning to the battery management unit BMU. The emergency stop level voltage is preferably set to a voltage larger than the over-discharge threshold voltage level, and so includes an ample (safety) margin above the over-discharge voltage level in order to reliably prevent over-discharge from occurring in the battery cells.

The battery management unit BMU starts the emergency stop operation according to the emergency stop warning from the cell monitoring unit CMU. More specifically, the battery management unit BMU opens the relay REL1 and REL2 to cut off the supply of power from the battery pack assembly to the inverter INV. This action stops the drop in output voltage from the battery cells. The battery management unit BMU also notifies the engine control unit ECU that the emergency stop operation was executed. The engine control unit ECU displays an indication showing that the emergency stop operation was initiated on a display device mounted at the driver's seat. The occurrence of battery cell over-discharging is reliably prevented in this way.

The operation when decelerating the electric vehicle is described next. When making the electric vehicle decelerate, the engine control unit ECU detects for example the driver depressing the brake pedal and issues a decelerator command to the inverter INV and the battery management unit BMU to decelerate the electric vehicle. The inverter INV switches the operating mode to alternate current-to-direct current conversion mode according to the decelerator command from the engine control unit ECU. The battery management unit BMU closes the relays REL1 and REL2 according to the decelerator command from the engine control unit ECU. The motor-generator MG generates electricity from the rotational force of the tires conveyed by way of the driveshaft, etc. The rotational resistance occurring from the generation of electricity is conveyed by way of the drive shaft to the drive wheels as a braking force. The electric vehicle is in this way made to decelerate. The braking method is generally given the name regenerative braking operation. The alternate current (AC) voltage generated by this regenerative braking operation is supplied to the inverter INV. The inverter INV converts the alternate current (AC) voltage from the motor-generator MG to a direct current (DC) voltage and supplies this DC voltage to the battery pack assembly. The battery pack assembly in this way performs charging from voltage recovered in the regenerative braking operation.

The regenerative braking operation charges the battery pack assembly so that the output voltage of each battery cell rises. Some measure must therefore be implemented to prevent overcharging of the battery cell. The voltage monitoring system VMS therefore constantly monitors the output voltage of each battery cell during vehicle driving. The cell monitoring unit CMU judges whether or not the output voltage of each battery cell is within the charging upper limit voltage at the start of the regenerative braking operation. If there is a battery cell whose output voltage is larger than the charging upper limit voltage then the cell monitoring unit CMU issues an overcharge warning to the battery management unit BMU. The battery management unit BMU opens the relays REL1 and REL2 according to the overcharge warning, and stops the charging of the battery pack assembly.

The cell monitoring unit CMU moreover continues to monitor the output voltage of the battery cells even during charging from the regenerative braking operation. When a battery cell is discovered where the output voltage has reached the charging upper limit voltage, the cell monitoring unit CMU sends the overcharging warning to the battery management unit BMU. The battery management unit BMU opens the relays REL1 and REL2 according to the overcharging warning to stop the charging of the battery pack assembly. Overcharging of the battery pack assembly is prevented in this way.

The description of the voltage monitoring system VMS operation assumes that the voltage of the battery cell can be correctly detected as already described. In fact however, the battery cell output voltage cannot always be detected correctly. For example if the line between the voltage monitoring modules VMM1 through VMMn and the battery pack assembly is disconnected (broken wire) then there will be an abnormal voltage drop or voltage rise at the line disconnect point, and the cell monitoring unit CMU will not be able to calculate the voltage correctly. If this type of wire disconnection occurs then the monitoring of battery cell output voltages which is the purpose of the voltage monitoring system VMS is impossible so that detection of wire disconnection breakdowns (electrical opens) is required.

A correct range of output voltage values is therefore prestored in the cell monitoring unit CMU. If the calculated output voltage value of the battery cells deviate from the correct range, then the cell monitoring unit CMU judges that a wire disconnect breakdown has occurred. The cell monitoring unit CMU notifies the battery management unit BMU that a wire disconnect breakdown has occurred. The battery management unit BMU opens the relays REL1 and REL2 according to the wire disconnect breakdown notification and cuts off the coupling between the inverter INV and the battery pack assembly. The system in this way prevents further problems from occurring. The battery management unit BMU also notifies the engine control unit ECU that a wire disconnect breakdown has occurred. The engine control unit ECU displays the wire disconnect breakdown information for example on a display device mounted at the driver's seat to inform the driver that a breakdown has occurred. The voltage monitoring system VMS is in this way capable of detecting that a wire disconnect breakdown has occurred.

The structure and the operation of the voltage monitoring system VMS are nothing more than examples. Therefore the cell monitoring unit CMU and the battery management unit BMU can for example be unified into one circuit block. Moreover, all or a portion of the functions delegated to the cell monitoring unit CMU and the battery management unit BMU can be mutually handled by either of these units. Furthermore, the cell monitoring unit CMU, the battery management unit BMU, and the engine control unit ECU can be unified into one circuit block. The engine control unit ECU can serve as a substitute to handle all or a portion of the functions of the cell monitoring unit CMU and the battery management unit BMU.

The voltage monitoring system of the first embodiment is a voltage monitoring system for monitoring multiple battery cells mutually coupled in series, and which includes the voltage monitoring modules VMM1 through VMMn for operating from a voltage received from at least one battery cell among multiple battery cells and monitoring the battery cell; and a module control circuit (e.g. cell monitoring unit CMU) for controlling the voltage monitoring modules VMM1 through VMMn. The voltage monitoring system of the first embodiment includes one feature in the configuration of the power supply circuit for the voltage monitoring modules VMM1 through VMMn and the operation of the module control circuits (e.g. cell monitoring unit CMU). The voltage monitoring modules VMM1 through VMMn configuration is therefore first of all described utilizing the voltage monitoring module VMM1 as an example. In the following description, the same reference numerals are attached to the same sections as described above and that description omitted.

Figure 4:
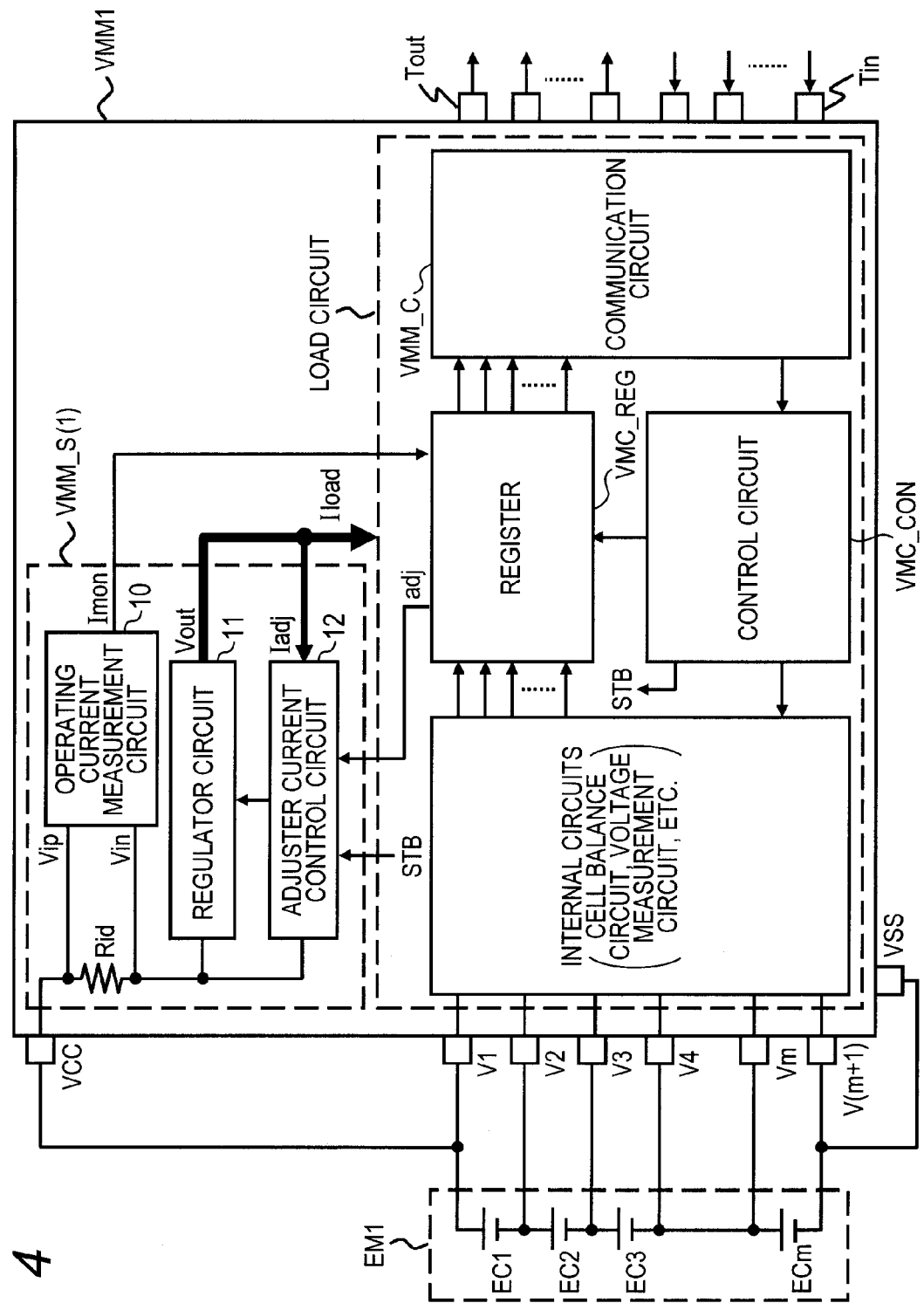
FIG. 4 is a block diagram of the voltage monitoring module of the first embodiment.

FIG. 4 is a block diagram of the voltage monitoring module VMM1 of the first embodiment. The voltage monitoring module VMM1 as shown in FIG. 4 includes internal circuits (circuits including the cell balance circuits CB1-CBm, voltage measurement circuit VMC) serving as load circuits, a register VMC_REG, a control circuit VMC_CON, and a communication circuit VMC_C. Also, the power supply circuit VMM_S generates a load current Iload and an internal voltage Vout from the power supply voltage applied from the power supply terminal VCC, and supplies this load current Iload and an internal voltage Vout to the load circuits.

As operating modes, the voltage monitoring module VMM1 of the first embodiment includes an initializing mode, a normal operating mode, and a sleep mode. The initializing mode is an operating mode that sets the operating current of the voltage monitoring module VMM in normal operating mode. The normal operating mode is a mode for the voltage monitoring module VMM to make voltage measurements of the battery cells EC1-ECm. The sleep mode is a power saving mode in which the voltage monitoring module VMM stops the voltage measurements of the battery cells EC1-ECm. Even though the operation of the main function circuits such as the voltage measurement circuit for the AD converter VMC_ADC was stopped by this sleep mode, those circuits required for communication with outside sections such as the communication circuit VMM_C, the register VMC_REG, and the control circuit VMC_CON as well as circuits required for shifting operation to the following operating modes still operate. Moreover, the power supply circuit VMM_S continues outputting the internal voltage Vout and the output current Iout even in the sleep mode.

In normal operating mode, the power supply circuit VMM_S generates a first reference current according to the first current code supplied from an outside unit, and along with generating an output current according to the first reference current, draws the adjusting current Iadj from the output current (except for the load current Iload) at the ground terminal VSS. In sleep mode, the power supply circuit VMM_S generates a second reference current smaller than the first reference current according to a second current code supplied from an outside unit, and along with generating an output current according to the second reference current, draws the adjusting current Iadj from the output current (except for the load current Iload) at the ground terminal VSS. The power supply circuit VMM_S can in this way maintain a fixed operating current during either of the normal operating mode or sleep mode, regardless of the size of the load current Iload.

The power supply circuit VMM_S includes the current detector resistor Rid, the operating current measurement circuit 10, the regulator circuit 11, and the adjusting current control circuit 12. In the voltage monitoring module VMM1 of the first embodiment, the power supply circuit VMM_S differs from a typical power supply circuit in the point of including a current detector resistor Rid, the operating current measurement circuit 10, and the adjusting current control circuit 12.

The current detector resistor Rid is mounted between the power supply terminal VCC, regulator 11, and the adjusting current control circuit 12. Operating current from the power supply terminal VCC flowing in the regulator 11, and the adjusting current control circuit 12, flows through the current detector resistor Rid. A voltage differential Vd is generated across both ends of the current detector resistor Rid according to the size of the operating current.

The operating current measurement circuit 10 measures the operating current according to the operating current measuring command sent from the cell monitoring unit CMU subsequent to the operating current switching command. More specifically, the operating current measurement circuit 10 measures the size of the operating current flowing in the power supply circuit VMM_S based on the voltage differential Vd, and generates the operating current measurement value Imon. In the operating current measurement circuit 10 of the first embodiment, the operating current measurement value Imon is set to a value that corresponds to the load current Iload, in order for the adjusting current control circuit 12 to operate in initializing mode where generation of the adjusting current Iadj was stopped according to the operation current switching command. The operation current measurement circuit 10 stores the operation current measurement value in the register VMC_REG. Further, in the first embodiment, the operating current measurement circuit 10 starts measuring the operating current according to the measurement start signal (not shown in drawing) generated in response to the measuring command that the control circuit VMC_CON received by way of the communication circuit VMM_C from the cell monitoring unit CMU.

The regulator circuit 11 generates an internal voltage Vout and output current from the power supply voltage supplied from the power supply terminal VCC, and supplies the internal voltage Vout to the load circuit. The regulator circuit 11 increases or decreases the output current according to the switched reference current generated by the adjusting current control circuit 12.

Along with generating an adjusting current Iadj so that the operating current consumed by the voltage monitoring module according to first operating current setting command sent from the cell monitoring unit CMU reaches a specified value corresponding to the first operating current setting command; the adjusting current control circuit 12 also stops generating the adjusting current Iadj according to the operating current switching command sent from the cell monitoring unit CMU. Moreover, the cell monitoring unit CMU sends a second operating current setting command based on the operating current measured by the operating current measurement circuit 10, and the adjusting current control circuit 12 in accordance with the second operating current setting command, generates the adjusting current Iadj in order to reach a specified value corresponding to the second operating current setting command. The adjusting current control circuit 12 generates the adjusting current Iadj so that the sum of this adjusting current and the load current consumed by circuits other than the adjusting current control circuit 12 within the voltage monitoring module VMM1 attains a specified value corresponding to the first or the second operating current setting command. Further, adjusting current control circuit 12 generates a reference current to serve as a reference for the size of the output current of the regulator circuit 11.

Figure 5:
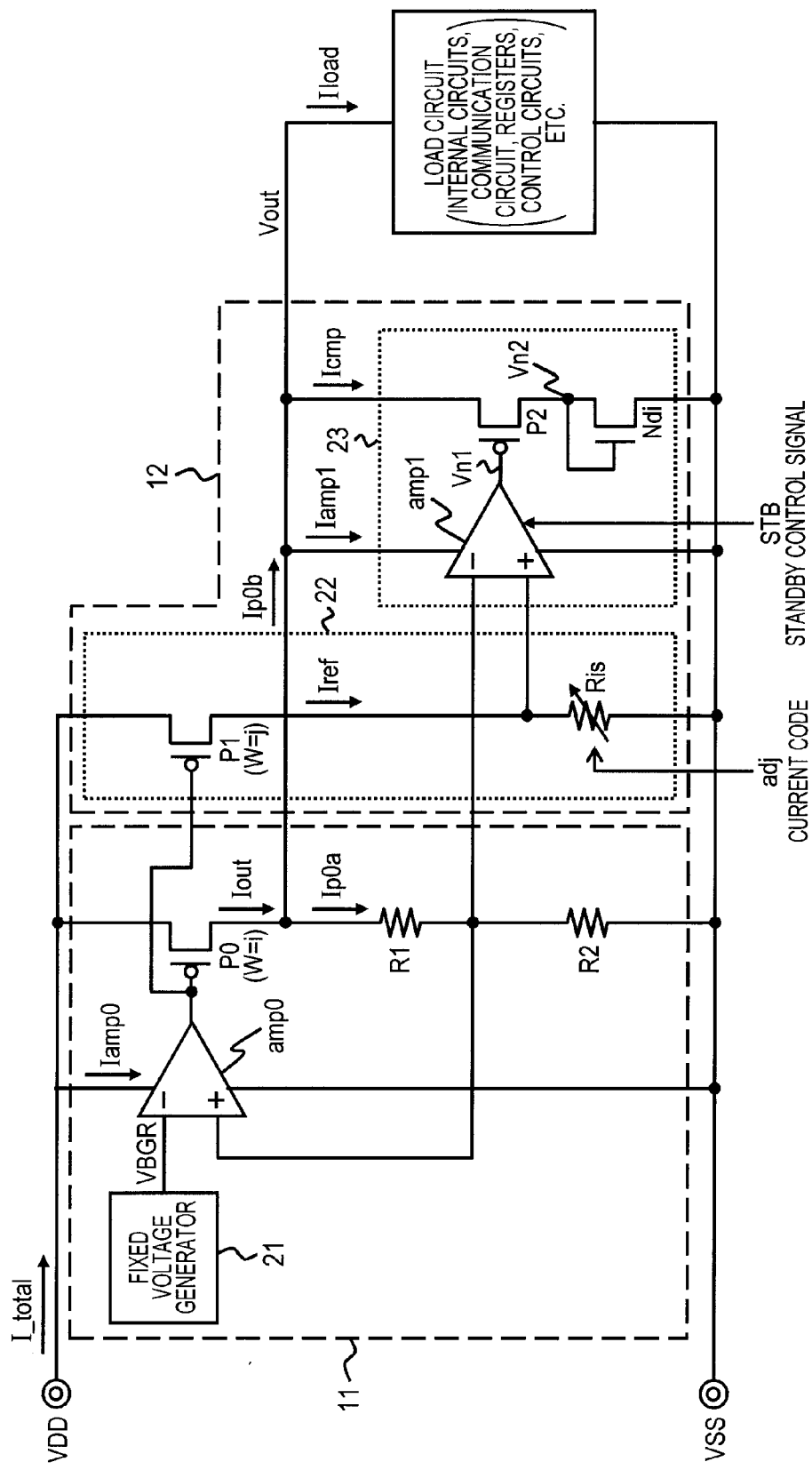
FIG. 5 is a block diagram of the adjusting current control circuit and the regulator unit for the power supply circuit of the first embodiment.

The regulator circuit 11 and the adjusting current control circuit 12 of the first embodiment are described next in detail. FIG. 5 is a block diagram of the regulator circuit 11 and the adjusting current control circuit 12 of the first embodiment.

The regulator circuit 11 as shown in FIG. 5 includes a fixed voltage generator unit 21, a first differential amplifier amp0, an output transistor P0, a first resistor R1, and a second resistor R2.

The fixed voltage generator unit 21 generates a reference voltage VBGR. This fixed voltage generator unit 21 is for example a bandgap voltage supply that outputs a bandgap voltage as the reference voltage VBGR. This reference voltage VBGR in other words has an extremely small fluctuation width relative to the temperature.

The output transistor P0 utilizes for example a PMOS transistor. The source of the output transistor P0 is coupled to the power supply terminal VCC. The first resistor R1 and the second resistor R2 are coupled in series between the drain and the ground terminal VSS of the PMOS transistor P0. The coupling point between the first resistor R1 and the drain of the PMOS transistor P0 is the output terminal of the regulator circuit 11. The fixed voltage generator unit 21 inputs a reference voltage VBGR to the inverting input terminal on the first differential amplifier amp0, and the non-inverting input terminal is coupled to the coupling point between the first resistor R1 and the second resistor R2. The output signal from the differential amplifier amp0 is supplied to the gate of the PMOS transistor P0. The first differential amplifier amp0 operates based on the ground voltage and the power supply voltage supplied from the power supply terminal VCC. The regulator circuit 11 in other words configures a forward amplifier circuit comprised of a first differential amplifier amp0, an output transistor P0, a first resistor R1, and a second resistor R2. This forward amplifier circuit sets the amplification rate according to the resistance ratio of the resistance value for the first resistor R1 and the resistance value for the second resistance R2. The forward amplifier circuit for the regulator circuit 11 amplifies the reference voltage VBGR according to the amplification rate and outputs an internal voltage Vout.

The adjusting current control circuit 12 includes a current setting circuit 22 and a current consumption circuit 23. The current setting circuit 22 generates a reference current serving as the reference for the side of the output current of the regulator circuit 11. The current consumption circuit 23 consumes the adjusting current Iadj for the load current Iload of the load circuit and the output current of the regulator circuit 11.

The current setting circuit 22 includes a current setting resistor Ris, and a PMOS transistor P1. The current setting resistor Ris varies the resistance value according to the current code adj. The PMOS transistor P1 configures the output transistor P0 and the current mirror. The source of the PMOS transistor P1 is coupled to the power supply terminal VCC, the drain is coupled to one end of the current setting resistor Ris, and the gate is coupled to the gate of the output transistor P0. One terminal of the current setting resistor Ris is coupled to the ground terminal VSS. The other terminal of the current setting resistor Ris is coupled to the non-inverting input terminal of the second differential amplifier amp1 of the current consumption circuit 23. Here, the inverting input terminal of the second differential amplifier amp1 is coupled to the non-inverting input terminal of the first differential amplifier amp0. Consequently, this virtual electrical short between the first differential amplifier amp0 and the second differential amplifier amp1 generates a voltage approximately equivalent to the reference voltage VBGR in the non-inverting input terminal of the second differential amplifier amp1. Also a voltage differential approximately equivalent to the reference voltage VBGR on both ends of the current setting resistor Ris so that a reference current Iref as the value of the reference voltage VBGR divided by the resistance value of the current setting resistor Ris then flows in the current setting resistor Ris.

In the voltage monitoring modules VMM1 of the first embodiment, the ratio of the gate width W of the output transistor P0, and the PMOS transistor P1 (in other words the transistor size ratio) i:j is set to i>j. Therefore a larger current flows is set in the output transistor Po than in the reference current Iref. So in the case of a ratio of i:j=5:1, the output current flowing in the output transistor P0 will be five times larger than the reference current Iref. In the regulator circuit 11, the current Ip0$b$ which is the output current Iout flowing in the output transistor P0 minus the current Ip0$a$ flowing in the resistors R1, R2, is output from the output terminal. The current Ip0$a$ is considerably smaller compared to the current Ip0$b$ so that in the following description Ip0$b$ is considered equal to Iout.

The current consumption circuit 23 includes the second differential amplifier amp1, the PMOS transistor P2, and the NMOS transistor Ndi. The non-inverting input terminal of the second differential amplifier amp1 is coupled to one end of the current setting resistor Ris, and the inverting terminal is coupled to the non-inverting input terminal of the first differential amplifier. The second differential amplifier amp1 operates based on the ground voltage and the internal voltage Vout that is output from the regulator circuit 11. The source of the PMOS transistor P2 is coupled to the output terminal of the regulator circuit 11, the drain is coupled to the drain of the NMOS transistor Ndi, and the gate is coupled to the output terminal of the second differential amplifier amp1. The source of the NMOS transistor Ndi is coupled to the ground terminal VSS, and the gate is coupled to the drain. The NMOS transistor Ndi in other words operates as a diode. This diode functions as a load circuit for the current consumption circuit 23. The PMOS transistor P2 extracts the current Icmp from the output current Iout according to the output signal from the second differential amplifier amp1, and supplies it to the NMOS transistor Ndi. A standby control signal STB is applied to the second differential amplifier amp1. When the standby control signal STB is in the enable state, the second differential amplifier amp1 stops the operation, and stops the current consumption circuit 23 operation. The reference current Iref still flows even if the current consumption circuit 23 operation was stopped by the standby control signal STB. However, the reference current Iref is extremely small compared to the operating current in the voltage monitoring modules VMM1 and so is a level that can mostly be ignored in terms of effects on the size of the operating current.

Figure 6:
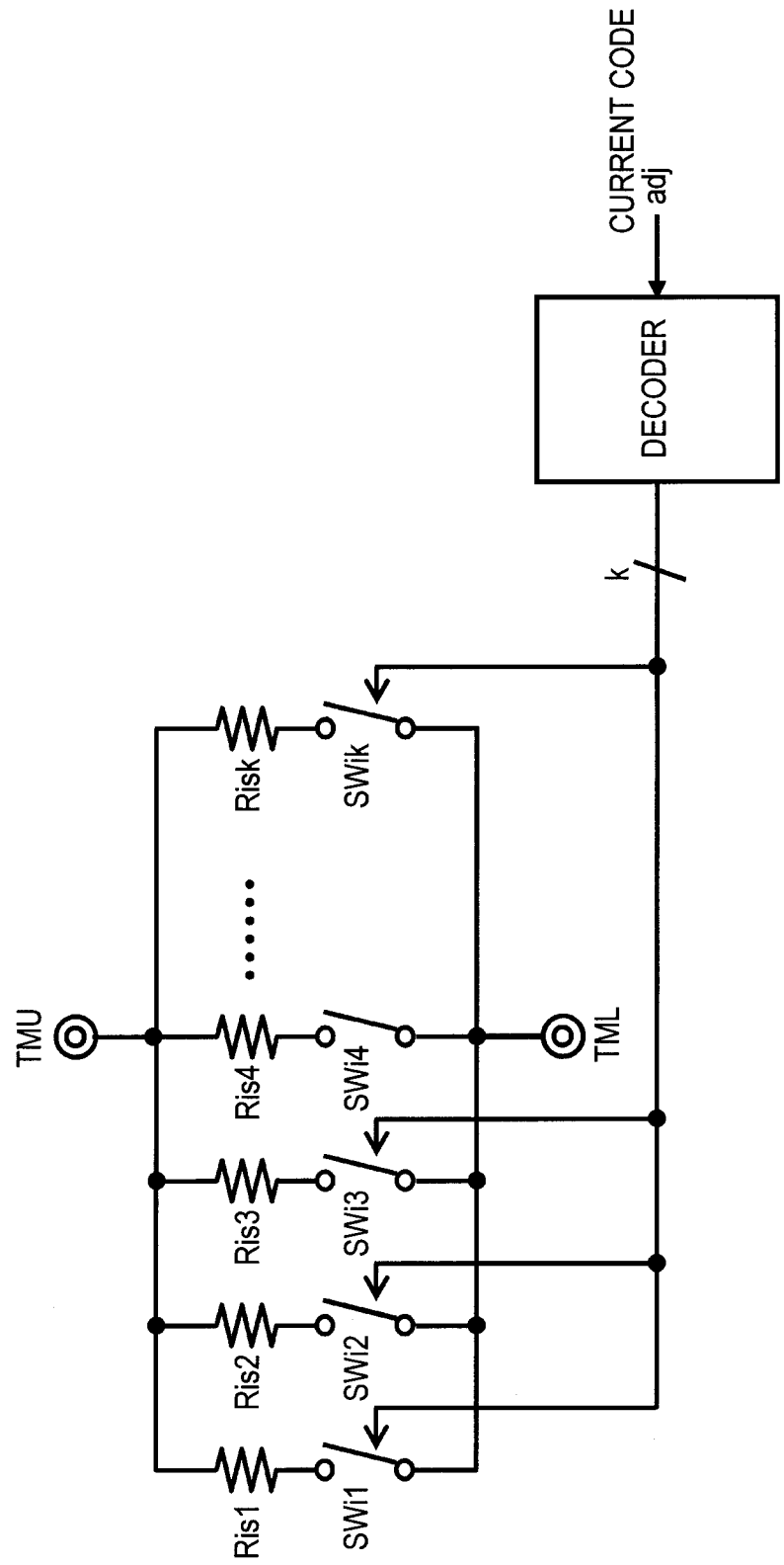
FIG. 6 is a block diagram of the current setting resistor of the first embodiment.

The structure of the current setting resistor Ris is described next. FIG. 6 is a block diagram showing the current setting resistor Ris. The current setting resistor Ris as shown in FIG. 6 includes multiple resistors Ri1-Rik coupled in parallel, and the switches SWi1-SWik coupled in series to the respective plural resistors, and a decoder. A current code adj is input to the decoder. This current code adj is a value supplied by the operating current setting command. The decoder sets any one of the switches SWi1-SWik to a conducting state according to the value of the current code adj. The resistors Ri1-Rik each possess different resistance values. One among the resistors Ri1-Rik is set as a resistor enabled during sleep mode, and has a considerably higher resistance value than the other resistors. The current setting resistor Ris includes a terminal TMU serving as one end of the current setting resistor Ris and a terminal TML serving as the other end (of the current setting resistor Ris).

Figure 7:
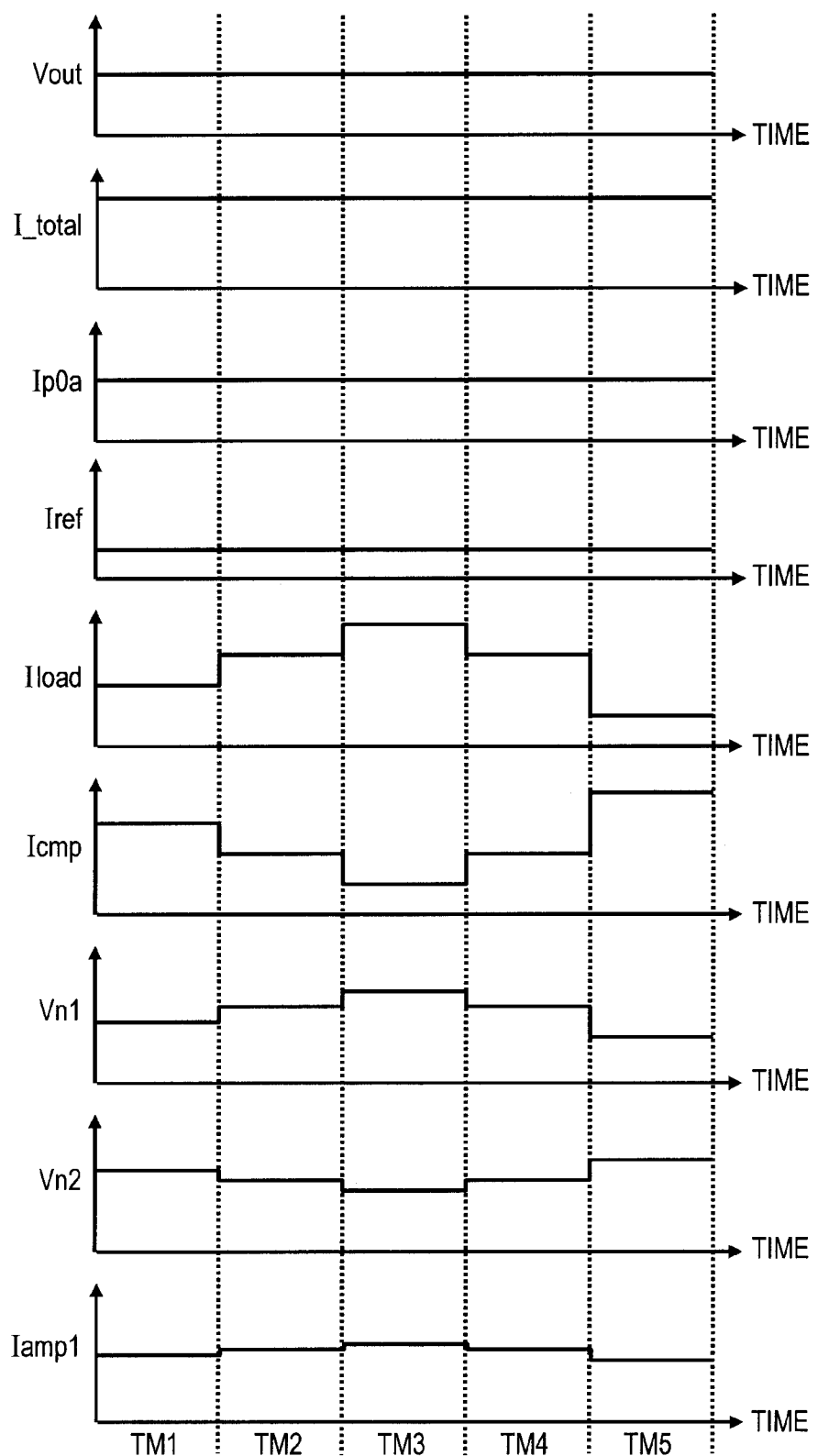
FIG. 7 is a graph showing the current output characteristics of the adjusting current control circuit and the regulator unit for the power supply circuit of the first embodiment.

The operation of the regulator circuit 11 and the adjusting current control circuit 12 of the first embodiment are described next. FIG. 7 is a timing chart showing the operation of the regulator circuit 11 and the adjusting current control circuit 12 of the first embodiment. In the example shown in FIG. 7, the load circuit Iload increases and decreases along with the passage of time.

As shown in FIG. 7, the current consumption circuit 23 lowers the current Icmp when the load current Iload has increased. The current Iout increases when the load current I load has increased. There is no fluctuation in the current Ip0a at this time. The reference current Iref also increases according to the increases in this current Iout. The voltage differential across both ends of the current setting resistor Ris therefore also increases. In other words, the voltage in the non-inverting input terminal of the second differential amplifier amp1 rises. The second differential amplifier amp1 therefore raises the (output) voltage Vn1 of the output signal applied to the gate of the PMOS transistor P2, and lowers the current drive capability of the PMOS transistor P2. The current Icmp therefore decreases when the load current Iload has increased. The current Iout decreases according to the drop in the current Icmp and the current Icmp attains a stable state.

However, if the load current Iload has decreased, then the current consumption circuit 23 raises the current Icmp. The current Iout decreases when the load current Iload has decreased. There is no fluctuation in the current Ip0a at this time. The reference current Iref then lowers according to the drop in this current Iout. The voltage differential across both ends of the current setting resistor Ris therefore lowers. In other words, the voltage of the non-inverting input terminal of the second differential amplifier amp1 then drops. The second differential amplifier amp1 therefore causes a voltage drop in the voltage Vn1 of the output signal applied to the gate of the PMOS transistor P2, and raises the current drive capability of the PMOS transistor P2. The current Icmp therefore increases if the load current Iload has decreased. The current Iout then increases according to the increase in the current Icmp, and the current Icmp attains a stable state.

The regulator circuit 11 and the adjusting current control circuit 12 of the first embodiment therefore function in this way so that the adjusting current control circuit 12 increases or decreases the current Icmp in order to cancel out the increase and decrease in the load current. The power supply circuit of the first embodiment can therefore handle an increase or decrease in the load current Iload while maintaining a fixed output current Iout in the regulator circuit 11.

The operation of regulator circuit 11 and the adjusting current control circuit 12 of the first embodiment is here described utilizing numerical formulas. First of all, the total current I_total of current flowing into the regulator circuit 11 and the adjusting current control circuit 12 from the power supply terminal VCC can be expressed by way of formula (1). In this formula (1), the Iout is set equal to Ip0b. In this formula of $$I\_total = Iout + Iref + Iamp0 \quad (1),$$

and the Iout in formula (1) is the size of the regulator circuit 11 output current; Iref is the size of the reference current generated by the current setting circuit 22; and Iamp0 is the size of the operating current of the first differential amplifier amp0.

The output current Iout of the regulator circuit 11 is expressed next in formula (2). In this formula (2), $$I\_out = Ip0a + Iload + Icmp + Iamp1 \quad (2),$$

and the Ip0a in formula (2) is the size of the current flowing in the first resistor R1 and the second resistor R2; the Iload is the size of the load current supplied to the load circuit; Icmp is the current drawn by the PMOS transistor P2 of the current consumption circuit 23; and Iamp1 is the size of the operating current of the second differential amplifier amp1.

Here, in the power supply circuit VMM_S, when the relation of the output transistor P0 and the PMOS transistor P1 is a transistor size ratio of N:1, then the relation in formula (3) is obtained between the reference current Iref and the output current Iout of the regulator circuit 11.

$$Iout = N \times Iref \quad (3)$$

When Ris is set as the size of the current setting resistor then the size of the reference current Iref is determined by the relation expression in formula (4).

$$Iref = VBGR/Ris \quad (4)$$

From the formulas (1), (3), (4), the current value I_total is then expressed by the formula (5).

$$I\_total = N \times Iref + Iref + Iamp0 = (1+N)Iref + Iamp0 = (1+N) \times VGBR/Ris + Iamp0 \quad (5)$$

In this formula (5), the Iamp0 is the consumption current of the first differential amplifier amp0 so that the value is fixed regardless of the operation state of the load circuit. The reference voltage VBGR is also fixed regardless of the state of the load circuit. Moreover, the current setting resistor Ris is a fixed value unless the input current code is rewritten. In other words, formula (5) reveals that the current flowing in the regulator circuit 11 and the adjusting current control circuit 12 is maintained at approximately a fixed value. Also in the power supply circuit VMM_S of the first embodiment, one can perceive from the formula (5) that the size of I_total can be set to a small value by setting the size of the resistance value of the current setting resistor Ris to a large value. One can also understand that the formula (5) does not include elements such as an offset component for the differential amplifier so that the small current value I_total can be accurately set in the power supply circuit VMM_S according to the first embodiment. One can also understand from formula (3) that the output current Iout of regulator circuit 11 can be maintained at approximately a fixed value.

Among the elements in formula (2), the current Ip0A is a constant determined by the internal voltage Vout, the first resistor R1 and the second resistor R2, and that the Iamp1 is approximately a fixed value not dependent on the state of the load circuit which is the operating current of the second differential amplifier. One can therefore understand that the output current Iout is a fixed value, and from formula (2) that a fixed Iload+Icmp are maintained. In other words, what can also be understood is that the load current Iload increases or decreases according to the state of the load circuit and that the current Icmp varies to cancel out the increase or decrease in the load current Iload.

The consumption current Iamp0 of the first differential amp0 is extremely small compared to the output current Iout and the reference current Iref so in the following description Iout+Iref are utilized as the power supply circuit operating current. Moreover, the current Ip0a is extremely small compared to the total value of the load current Iload, the consumption current Iamp1 of the first differential amplifier amp1, and the drawn current Icmp so that in the following description, the Iload+Icmp+Iamp1 are utilized as the output current Iout. Also, the adjusting current Iadj that the adjusting current control circuit 12 bleeds out to the ground terminal VSS contains the current Icmp and the current Iamp1.

The power supply circuit VMM_S of the first embodiment according to the above description, the current setting circuit 22 generates a reference current Iref based on the reference voltage VBGR and the resistance value of the current setting resistor Ris. The current setting circuit 22 sets the output current Iout of the regulator circuit 11 based on the applicable reference current Iref. Moreover, in the power supply circuit VMM_S, the current consumption circuit 23 draws the adjusting current Iadg for the output current Iout and load current Iload to the ground terminal. The power supply circuit VMM_S can in this way set the operating current I_total to a fixed value regardless of the increase or decrease in the load current Iload.

In the power supply circuit VMM_S, the reference current Iref can be accurately set in a wide dynamic range by utilizing the current code adj to vary the resistance value of the current setting resistor Ris. The power supply circuit VMM_S in this way can maintain the operating current I_total at a fixed value in either case of a large operating current I_total and a small operating current I_total.

The methods for setting the operating current of the voltage monitoring modules VMM1 through VMMn are described next. In the voltage monitoring system of the first embodiment, the cell monitoring unit CMU sets the range of the operating current for the voltage monitoring modules VMM1 through VMMn. The voltage monitoring modules VMM1 through VMMn then set the operating current based on the current code that was set by the cell monitoring unit CMU.

In the first embodiment, the cell monitoring unit CMU sends the operating current setting command, the operating current switching command, and the operating current measuring command to the voltage monitoring modules VMM1 through VMMn. The operating current setting command includes the current code adj. If the voltage monitoring modules VMM1 through VMMn have received the operating current setting command, then the adjusting current control circuit 12 generates an adjusting current Iadj so that the operating current consumed by the voltage monitoring modules VMM1 through VMMn attains a specified value corresponding to the operating current setting command. Also, if the voltage monitor modules VMM1 through VMMn have received the operating current switching command, then the adjusting current control circuit 12 stops generating the adjusting current Iadj. If the voltage monitoring modules VMM1 through VMMn have received the operating current measuring command, then the operating current is measured. The operating current measuring command is sent subsequent to the operating current switching command. Moreover, after rewriting the value of the current code adj contained in the operating current setting command based on the measured operating current, the cell monitoring unit CMU sends an operating current setting command including the rewritten current code adj. The operating current setting command containing the not yet rewritten current code adj is equivalent to the first operating current setting command, and the operating current setting command containing the rewritten current code adj is equivalent to the second operating current setting command.

Also in the first embodiment, the cell monitoring unit CMU outputs a first current code (e.g. operating current code) specifying the size of the first operating current in normal operating mode for monitoring the battery cells by the load circuit; which is current value that is the same or larger than the load current Iload of the voltage monitoring modules VMM1 through VMMn. The first operating current setting command and the second operating current setting command include the first current code. The cell monitoring unit CMU outputs a second current code (e.g. sleep current code) specifying the size of a second operating current smaller than the first current code, and which is the size of the operating current in sleep mode for stopping the monitoring of the battery cells by the load circuit. The operating current specified by the second current code is measured at times such as prior to product shipping or is specified as an operating current larger than the operating current that was calculated for sleep mode in the design stage. The operating current setting command containing this second current code is equivalent to the third operating current setting command. Along with performing operation based on the first operating current specified by the first current code during normal operating mode, the power supply circuit VMM_S for the voltage monitoring modules VMM1 through VMMn, also maintains the first operating current at a fixed value regardless of the increase or decrease in the load current Iload. Along with performing operation based on the second operating current set by the second current code for sleep mode, the power supply circuit VMM_S for the voltage monitoring modules VMM1 through VMMn, also maintains the second operating current at a fixed value regardless of the increase or decrease in the load current Iload.

The cell monitoring unit CMU executes commands such as the sleep mode shift command, the normal operating mode shift command, the operating current measurement value readout command, and the battery cell voltage measurement value readout command on the voltage monitoring modules VMM1 through VMMn.

Figure 8:
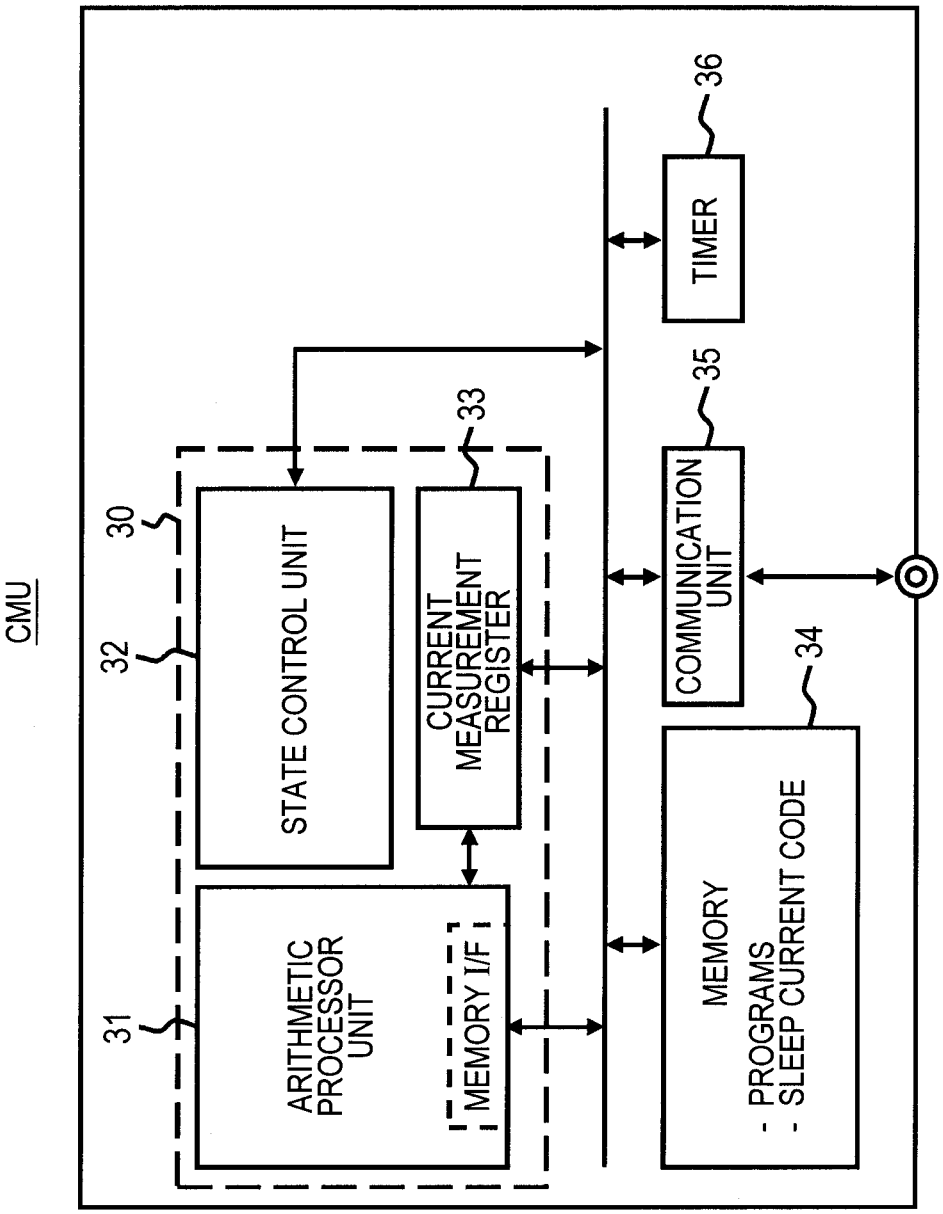
FIG. 8 is a block diagram of the cell monitor unit of the first embodiment.

FIG. 8 is a block diagram of the cell monitoring unit CMU. The cell monitoring unit CMU as shown in FIG. 8 includes a processor element 30, a memory 34, a communication unit 35, and a timer 36. The memory 34 stores a program to operate the voltage monitoring modules, and a second current code (sleep current code) utilized during sleep mode. The communication unit 35 is a communication interface for performing communication between the cell monitor unit CMU and voltage monitoring modules or the battery management unit BMU. The timer 36 measures the specified time set based on the program.

The processor element 30 loads the program from the memory 34 and operates based on the applicable program. In the example shown in FIG. 8, the processor element 30 includes an arithmetic processing unit 31, a state control unit 32, and a current setting register 33. The arithmetic processing unit 31 includes a memory interface and communicates by way of the applicable memory interface with the memory 34. The arithmetic processing unit 31 generates a first current code (operating current code) based on the program loaded from the memory 34 and makes a pass/fail decision of the battery cell voltage measurement results. The state control unit 32 outputs a control command to the voltage monitoring modules VMM1 through VMMn based on the interrupt commands applied from the other devices by way of the communication unit 35 and interrupt commands that the arithmetic processing unit 31 supplied by way of the bus. These control commands include the operating current setting command, the operating current switching command, the operating current measuring command, the sleep mode shift command, the normal operating mode command, the operating current measurement value load command, and the battery cell voltage measurement value load command. The current measurement register 33 stores the operating current measurement values loaded from the voltage monitoring modules VMM1 through VMMn.

Figure 9:
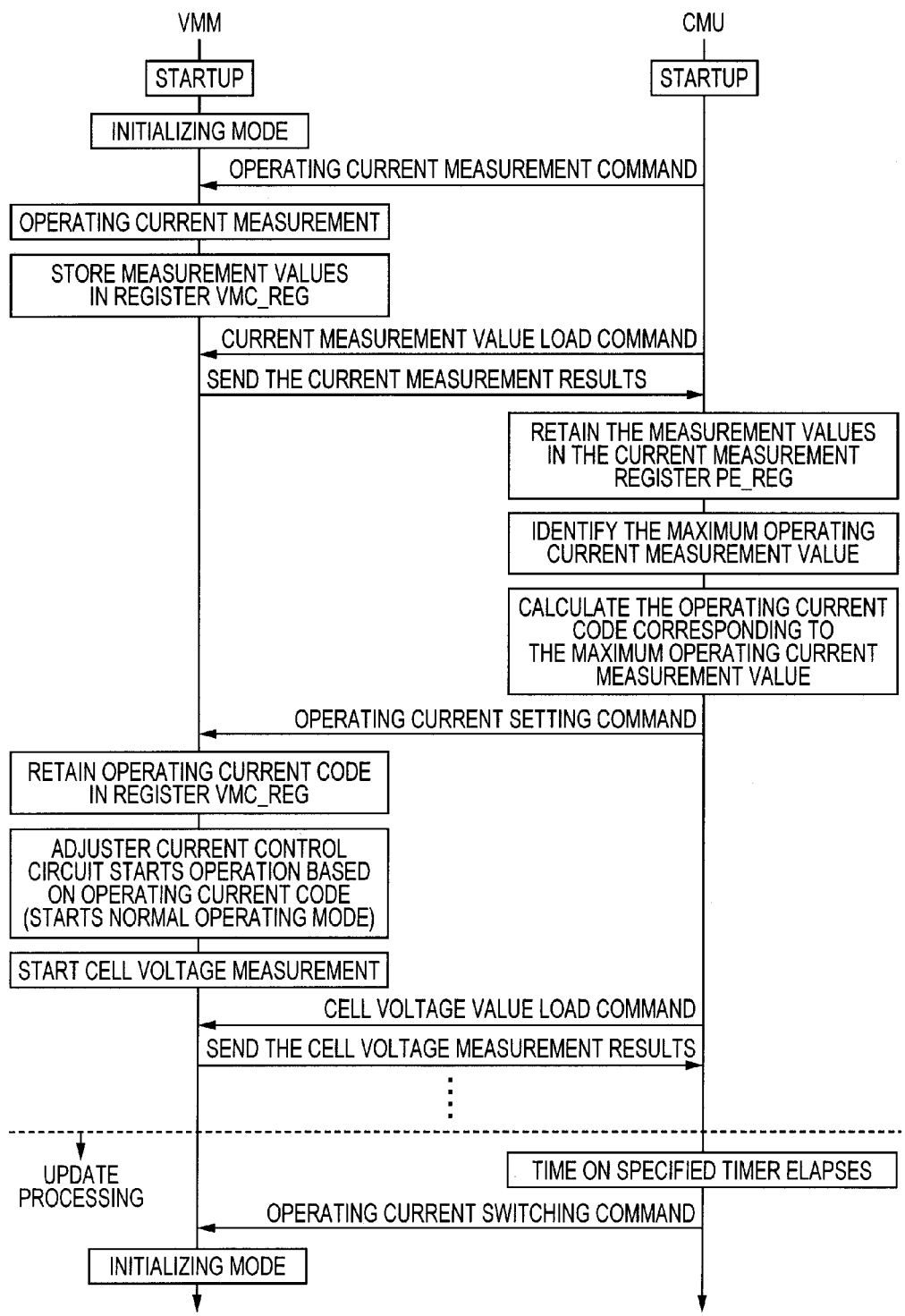
FIG. 9 is a sequence diagram showing the procedure for setting the operating current during normal operation mode in the voltage monitor system of the first embodiment.

The procedure used by the cell monitoring unit CMU for setting the size of the operating current consumed by the voltage monitoring modules VMM1 through VMMn in normal operating mode is described next. FIG. 9 is a sequence diagram showing the procedure for setting the operating current during normal operating mode in the voltage monitoring system of the first embodiment.

As shown in FIG. 9, the voltage monitoring modules VMM1 through VMMn and the cell monitoring unit CMU start operation from the startup process. This startup process for example begins from a power-on reset signal generated according to the voltage level of the power supply voltage. When the startup procedure ends, the voltage monitoring modules VMM1 through VMMn first of all start operating in the initializing mode. This initializing mode is a mode that stops the current consumption circuit 23 of the adjusting current control circuit 12 based on the standby control signal STB output by the control circuit VMC_CON within the voltage monitoring modules VMM1-VMMn. Namely, in initializing mode the operating current in the power supply circuit VMM_S fluctuates according to the load current Iload without drawing any adjusting current Iadj by way of the current consumption circuit 23. The voltage monitoring modules VMM1-VMMn shift to initializing mode may be made based on a command from the cell monitoring unit CMU after the startup processing ended. When the startup process is complete, the cell monitoring unit CMU outputs an operating current measuring command to the voltage monitoring modules VMM1-VMMn.

The voltage monitoring modules VMM1-VMMn measure the size of the current flowing in the power supply circuit VMM_S according to receiving of the operating current measuring command output by the cell monitoring unit CMU and generate operating current measurement values according to the size of the load current. The voltage monitoring modules VMM1-VMMn store the operating current measurement values in the register VMC_REG.

The cell monitoring unit CMU outputs an operating current measurement value load command to the voltage monitoring modules VMM1-VMMn. The voltage monitoring modules VMM1-VMMn send operating current measurement values stored in the register VMC_REG to the cell monitoring unit CMU based on the applicable load commands.

The cell monitoring unit CMU stores the received operating current measurement values in the current measurement register 33. The arithmetic processing unit 31 of the processor element 30 specifies the operating current measurement value that is the largest value among the operating current measurement values stored in the current measurement register 33. The arithmetic processing unit 31 further generates a first current code (e.g. operating current code) corresponding to the specified maximum operating current measurement value. This operating current code includes a value specifying a current value that is the same or greater than the maximum operating current measurement value. This operating current code is preferably set to a current value to which a specified margin has been added to the maximum operating current measurement value. This added margin is for the purpose of achieving stable circuit operation relative to fluctuations in the load current.

The cell monitoring unit CMU next sends an operating current setting command including the generated operating current code to the voltage monitoring modules VMM1-VMMn. This operating current code is stored in the register VMC_REG of the voltage monitoring modules VMM1-VMMn. Then, along with the adjusting current control circuit 21 switching the operating current code stored in the register VMC_REG to the reference current value as the current code adj, the control circuit VMC_CON set the standby control signal STB to the enable state. The voltage monitoring modules VMM1-VMMn in this way start operation in the normal operating mode.

In normal operating mode, the power supply circuit VMM_S operates from operating current based on a first current set by the normal current code. In other words, in the normal operating mode, any of the voltage monitoring modules can set the operating current based on the operating current code generated by the central monitoring unit CMU even in the case of multiple voltage monitoring modules and can equalize the operating current among the voltage monitoring modules.

The voltage monitoring modules VMM1-VMMn then start measuring the battery cell voltages. The voltage monitoring modules VMM1-VMMn then send the battery cell voltage measurement results to the central monitoring unit CMU in response to a request from the central monitoring unit CMU. This battery cell voltage measurement processing is performed at specified intervals.

Figure 10:
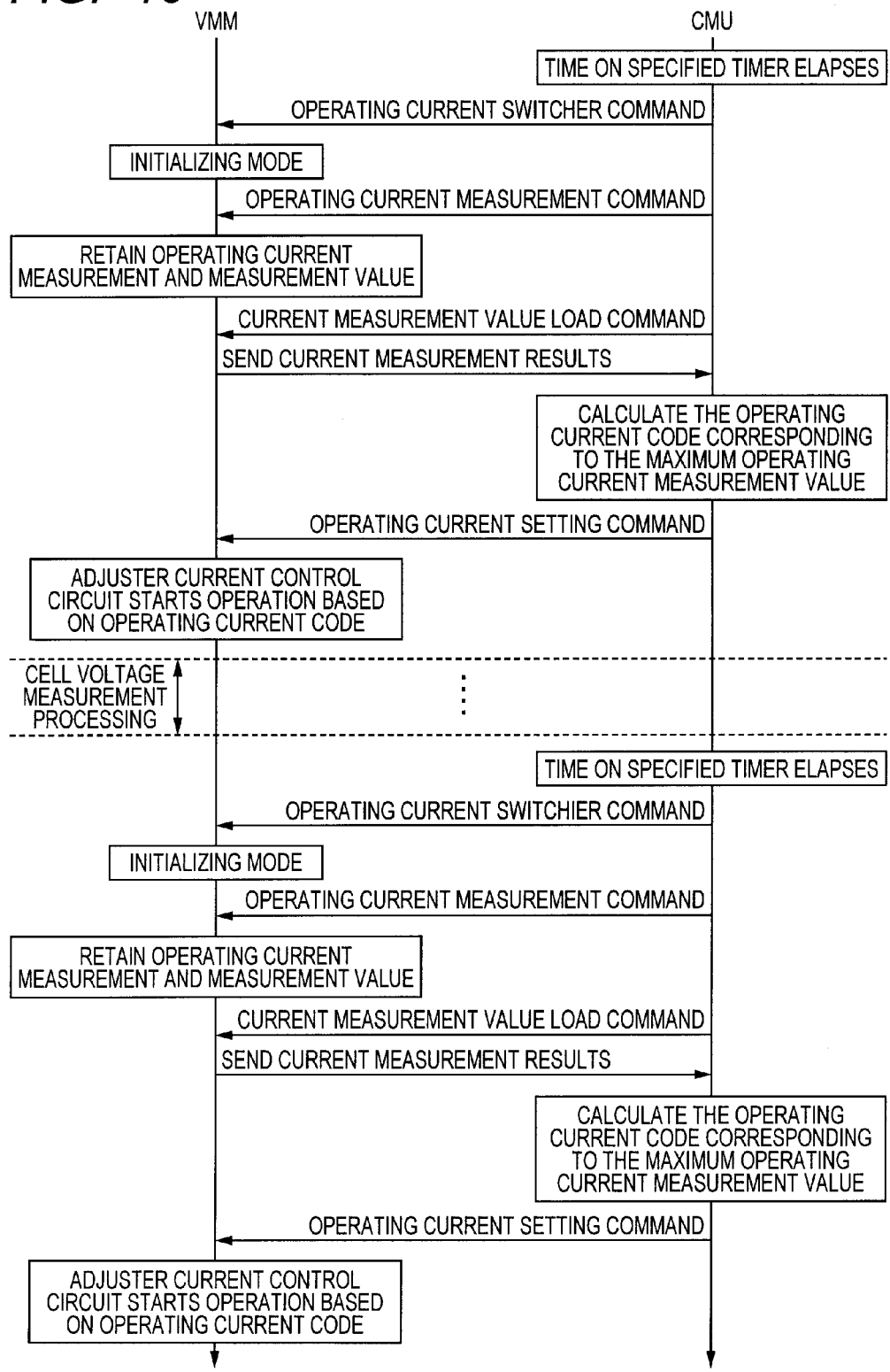
FIG. 10 is a sequence diagram showing the procedure for updating the operating current in the voltage monitoring system of the first embodiment.

In the voltage monitoring system of the first embodiment, the process to rewrite (update) the operating current is also performed at specified intervals. The procedure for the central monitoring unit CMU to rewrite the size of the voltage monitoring modules VMM1-VMMn operating current is therefore described next. FIG. 10 is a sequence diagram showing the procedure for rewriting the operating current during normal operating mode in the voltage monitoring system of the first embodiment. In the sequence diagram shown in FIG. 10, the detailed operation in the respective circuit blocks was simplified in order to focus on the sending and receiving of commands with the voltage monitoring modules VMM1-VMMn and the cell monitoring unit CMU, however the detailed operation of the circuit blocks for each command is the same operation as shown in FIG. 9.

As shown in FIG. 10, when a specified time on a timer in the cell monitoring unit CMU elapses, then the cell monitoring unit CMU sends an operating current switching command to the voltage monitoring modules VMM1-VMMn. The voltage monitoring modules VMM1-VMMn shift to the initializing mode in response to the operating current switching command. The adjusting current control circuit 12 in this way stops the current consumption circuit 23 based on the standby control signal STB output by the control circuit VMC_CON within the voltage monitoring modules VMM1-VMMn.

The cell monitoring unit CMU sends an operating current measuring command to the voltage monitoring modules VMM1-VMMn subsequent to the operating current switching command. The voltage monitoring modules VMM1-VMMn measure the size of the voltage measurement module operating current according to the operating current measuring command, and generate an operating current measurement value corresponding to the size of the load current. The voltage monitoring modules VMM1-VMMn then store the operating current measurement values in the register VMC_REG.

The cell monitoring unit CMU next outputs an operating current measurement value load command to the voltage monitoring modules VMM1-VMMn. The voltage monitoring modules VMM1-VMMn send the operating current measurement values stored in the register VMC_REG to the cell monitoring unit CMU based on the applicable load command.

The cell monitoring unit CMU then specifies an operating current measurement value that is the maximum value among the received operating current measurement values, and rewrites the operating current code to a value corresponding to the specified maximum operating current measurement value. The cell monitoring unit CMU next sends an operating current setting command including the rewritten operating current code to the voltage monitoring modules VMM1-VMMn. The voltage monitoring modules VMM1-VMMn then generate an adjusting current Iadj corresponding to the operating current code contained in the received operating current setting command and start the operation.

After a specified time on the timer then elapses in the cell monitoring unit CMU, the cell monitoring unit CMU sends the operating current switching command to the voltage monitoring modules VMM1-VMMn, and rewrites the operating current cod based on the maximum operating current of the voltage monitoring modules VMM1-VMMn at that time, and rewrites the size of the voltage monitoring modules VMM1-VMMn operating current by utilizing the rewritten operating current code.

Figures 11, 12:
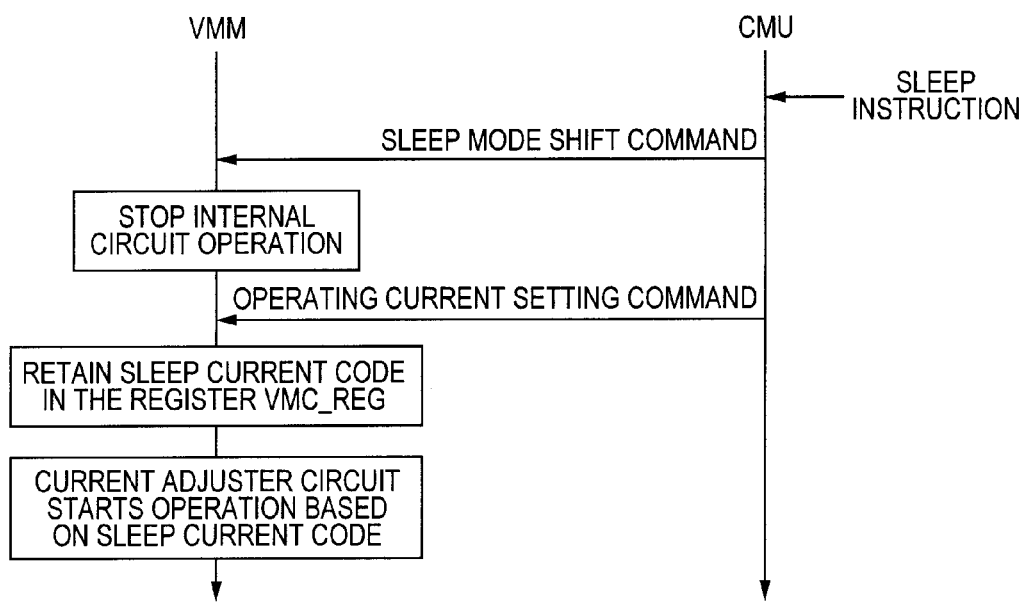
FIG. 11 is a table for describing the operating current during normal operating mode in the voltage monitoring module in the voltage monitoring system in the first embodiment.
FIG. 12 is a sequence diagram showing the procedure for shifting to sleep mode from normal operating mode in the voltage monitoring system of the first embodiment.

The operating current I_total for the voltage monitoring module that was set according to the processing in FIG. 9 and FIG. 10 is described. FIG. 11 shows a table for describing the operating current during normal operating mode in the voltage monitoring module in the voltage monitoring system of the first embodiment. In the example shown in FIG. 11, the maximum operating current among the voltage monitoring modules in initializing mode is 45 mA in the voltage monitoring module VMM1. A value that is larger than 4.5 mA (e.g. 5 mA) is therefore specified by the normal current code in the voltage monitoring system of the first embodiment. The operating current of all voltage monitoring modules in normal operating mode in this way becomes 5 mA in the voltage monitoring system of the first embodiment.

Next, FIG. 12 shows a sequence diagram of the procedure for shifting the voltage monitoring modules in the voltage monitoring system of the first embodiment from normal operating mode to sleep mode. As shown in FIG. 12, when for example the battery management unit BMU inputs a sleep instruction to the state control unit 32 of the cell monitoring unit CMU, then the state control unit 32 sends a sleep mode shift command to the voltage monitoring module. The control circuit VMC_CON in this way sets the circuits such as the voltage measurement circuit to a stop state in the voltage monitoring modules VMM1-VMMn.

The cell monitoring unit CMU next sends an operating current setting command including a sleep current code to the voltage monitoring modules VMM1-VMMn. The voltage monitoring modules VMM1-VMMn then stores the sleep current code in the register VMC_REG. The voltage monitoring modules VMM1-VMMn then starts operation by way of the second operating current that was set by the sleep current code. This sleep current code is for specifying a preset operating current and the sleep current code value is determined by simulation in the design stage or an inspection performed after manufacture.

The I_total for the voltage monitoring module set by the operating current according to the process in FIG. 12 is described. FIG. 13 shows a table describing the operating current during sleep mode in the voltage monitoring modules of the voltage monitoring system of the first embodiment. In the example shown in FIG. 13, the operating current of the voltage monitoring modules in sleep mode are set to 30 µA in all the voltage monitoring modules. In this sleep mode, the load current of the load circuit is 25 µA in all of the voltage monitoring modules, and the adjusting current Iadj flowing from the adjusting current control circuit 12 is 5 µA in all of the voltage monitoring modules. However, when there are large irregularities (variations) in the load current of the load circuit due to manufacturing variations, then the error in the load current due to these irregularities is absorbed by the adjusting current Iadj of the adjusting current control circuit 12.

Figure 14:
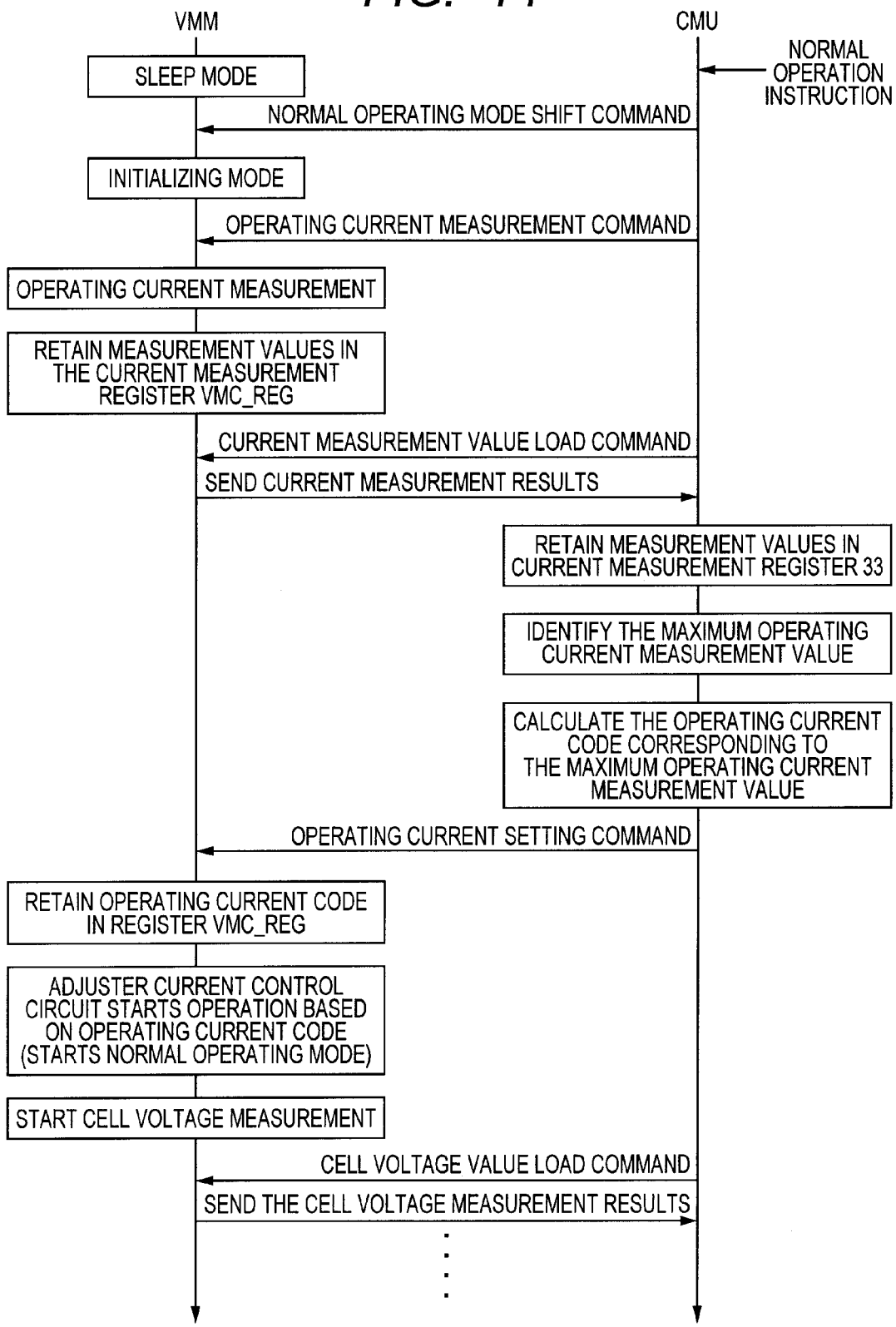
FIG. 14 is a sequence diagram showing the procedure for shifting to normal operating mode from sleep mode in the voltage monitoring system of the first embodiment.

Next, FIG. 14 shows a sequence diagram of the procedure for shifting from sleep mode to the normal operating mode in the voltage monitoring module of the voltage monitoring system of the first embodiment. As shown in FIG. 14, for example, the battery management unit BMU, etc. input a normal operating mode instruction to the state control unit 32 of the cell monitoring unit CMU, then the state control unit 32 sends a normal operating mode shift command to the voltage monitoring module. The control circuit VMC_CON in this way sets the voltage measurement circuit, etc. to the operating state in the voltage monitoring modules VMM1-VMMn, and moreover shifts the adjusting current control circuit 12 to initializing mode as the stop state.

Then in initializing mode, the cell monitoring unit CMU and the voltage monitoring modules VMM1-VMMn perform the same processing as the procedure for setting the normal current code during startup such as for obtaining the operating current measurement values.

In the voltage monitoring system of the first embodiment described above, an adjusting current Iadj is generated in each of the voltage monitoring modules VMM1-VMMn in order to equalize the operating current in the voltage monitoring modules VMM1-VMMn. The voltage monitoring modules VMM1-VMMn at this time set the operating current including adjusting current Iadj to a specified value that corresponds to the operating current code adj contained in the first operating current setting command sent from the cell monitoring unit CMU. In the voltage monitoring system of the first embodiment, the voltage monitoring modules VMM1-VMMn stop the adjusting current Iadj according to the operating current switching command sent by the cell monitoring unit CMU, and the voltage monitoring modules VMM1-VMMn measure the operating current with the adjusting current Iadj in a stop state (initializing mode) according to the operating current measuring command sent following the operating current switching command sent by the cell monitoring unit CMU, and the cell monitoring unit CMU rewrites the operating current code based on this measured operating current and also sends an operating current setting command (second operating current setting command) including the rewritten operating current code, and the voltage monitoring modules VMM1-VMMn generate an adjusting current Iadj so that the operating current attains a specified value corresponding to the second operating setting command. In other words, in the voltage monitoring system of the first embodiment, the size of the operating current including the adjusting current Iadj consumed by the voltage monitoring modules VMM1-VMMn can be rewritten (or updated) according to the size of the load current Iload except for the adjusting current Iadj. The voltage monitoring system of the first embodiment can in this way maintain the operating current among the voltage monitoring modules in a uniform (equalized) state by rewriting the operating current code so as to increase the size of the operating current including the adjusting current Iadj, even in cases where the load current Iload was increased in the voltage monitoring modules VMM1-VMMn. Moreover, the voltage monitoring system of the first embodiment can maintain the operating current among the voltage monitoring modules in a uniform (equalized) state by rewriting the operating current code so as to decrease the size of the operating current including the adjusting current Iadj, even in cases where the load current Iload has increased in the voltage monitoring modules VMM1-VMMn. Also in the voltage monitoring system of the first embodiment, the operating current can be equalized to the most ideal value by resetting, even in cases where the size of the operating current must be reset, so that an imbalance in the consumption current among the voltage monitoring modules can be limited and the battery life can be extended.

In the voltage monitoring system of the first embodiment, the cell monitoring unit CMU sets the operating current in the voltage monitoring modules based on the normal current code specifying an operating current larger than the maximum value of the load current in the voltage monitoring modules. The voltage monitoring system of the first embodiment can in this way equalize the operating current in the voltage monitoring modules.

Figure 18:
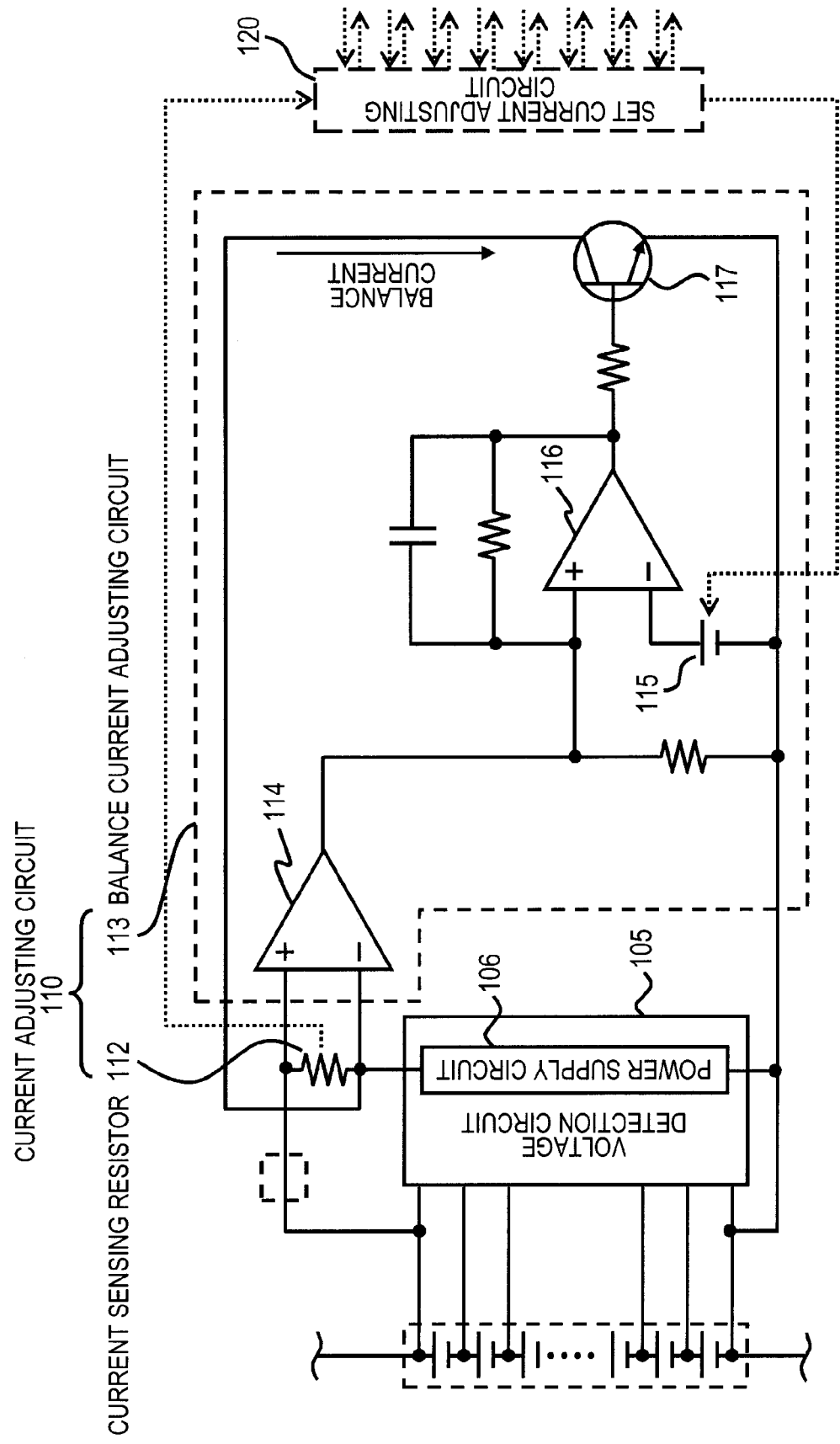
FIG. 18 is a block diagram of the current adjusting circuit described in Japanese Unexamined Patent Application Publication No. 2010-81692.

The vehicular power supply device in Japanese Unexamined Patent Application Publication No. 2010-81692 does not contain a mechanism for equalizing the current consumption in low current consumption modes such as sleep mode. As shown in FIG. 18, the vehicular power supply device described in Japanese Unexamined Patent Application Publication No. 2010-81692 for example, detects an increase or decrease in current consumption by way of a voltage differential across both ends of the current detector resistor 112. Therefore in the vehicular power supply device in Japanese Unexamined Patent Application Publication No. 2010-81692 when the consumption current has dropped by approximately a double-digit figure, there is nearly no difference between the voltage differential across both ends of the current detection resistor 112 and the offset voltage on the differential amplifier 114, so that the differential amplifier 114 cannot correctly perform amplification. This state reveals that the vehicular power supply device in Japanese Unexamined Patent Application Publication No. 2010-81692 does not possess a mechanism for equalizing the consumption current in low power consumption modes such as sleep mode. In other words, the vehicular power supply device in Japanese Unexamined Patent Application Publication No. 2010-81692 possesses the problem that the device is incapable of reducing voltage irregularities (variations) among the battery cells caused by consumption current (such as leak current) in sleep mode.

In contrast, the load current Iload in the voltage monitoring modules VMM1-VMMn has a drop in sleep mode that is smaller than a two-digit figure. In the voltage monitoring system of the first embodiment, when there is a large fluctuation in this type of load current, the operating current can be set smaller to match fluctuations in the load current Iload and in this way extend the life of the battery cell. This result is obtained because in the voltage monitoring system of the first embodiment the operating current of the voltage monitoring modules in sleep mode is determined based on a preset sleep current code. So in the voltage monitoring system of the first embodiment, the operating current during sleep mode can be set with greater accuracy than the case where setting the sleep mode operating current based on measurement results. In other words, the voltage monitoring system of the first embodiment is capable of adjusting the operating current according to the drop in consumption current during sleep mode and so battery consumption can be limited and the drive distance of the vehicle can be extended.

The voltage monitoring system of the first embodiment can further specify the maximum value of the load current Iload from the load current Iload values acquired from all the voltage monitoring modules during startup of the voltage monitoring system or during the update (rewrite) processing of the normal current code. Therefore when there is definitely an abnormal current among the acquired operating current measurement values, the voltage monitoring system of the first embodiment can detect (identify) the defective voltage measurement module of that abnormal current measurement value by detecting that applicable abnormal current measurement value.

Second Embodiment

Figure 15:
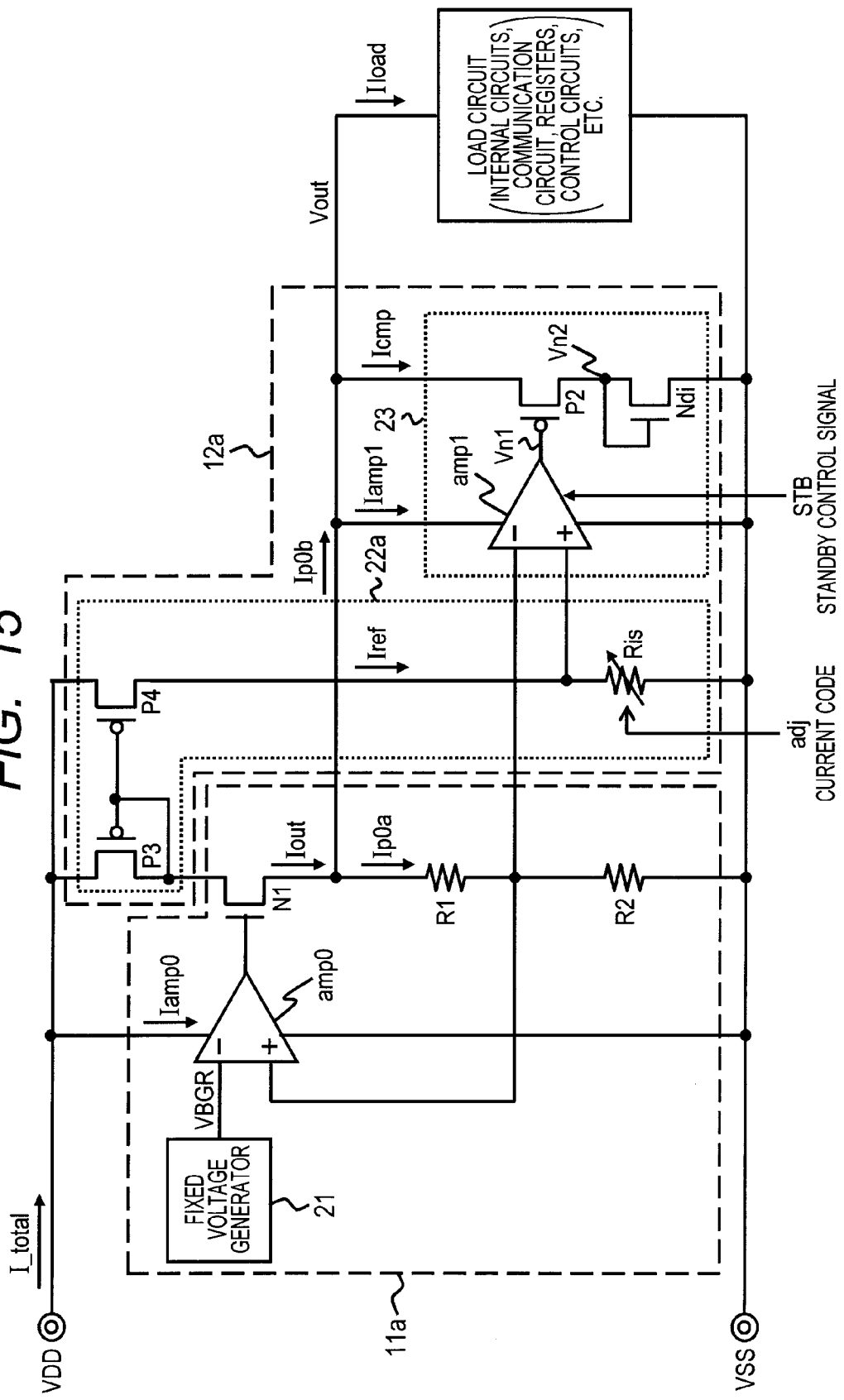
FIG. 15 is a block diagram of the adjusting current control circuit and the regulator unit for the power supply circuit of the second embodiment.

The second embodiment is described by utilizing an example that is a variation of the regulator circuit 11 and the adjusting current control circuit 12. FIG. 15 is a block diagram showing the regulator circuit 11a which is a modification or variation example of the regulator circuit 11, and the adjusting current control circuit 12a which is a modification or variation example of the adjusting current control circuit 12.

In the regulator circuit 11a shown in FIG. 15 the output transistor P0 of the regulator circuit 11 was substituted with an output transistor N1 configured by a NMOS transistor.

Further in the adjusting current control circuit 12a as shown in FIG. 15, the PMOS transistor P1 of the adjusting current control circuit 12 was substituted with a current mirror circuit configure by the PMOS transistors P3 and P4. The reference numeral 23a was affixed to the current setting circuit containing these PMOS transistors P3 and P4.

The source of the output transistor N1 is coupled to one end of the first resistor R1, the drain is coupled to the drain of the PMOS transistor P3, and the output signal of the first differential amplifier amp0 is supplied to the gate.

The source of the PMOS transistor P3 is coupled to the power supply terminal VCC, and the drain and gate are coupled in common. The PMOS transistor P4 is coupled by a current mirror coupling to the PMOS transistor P3. A current setting resistor Ris is coupled between the drain of the PMOS transistor P4 and ground terminal.

Even in this type of configuration, an output current Iout whose size is set based on the reference current Iref, flows in the output transistor N1. The relation between the output current Iout and the reference current Iref is determined by the transistor size ratio of the PMOS transistors P3, P4. The operation of the regulator circuit 11a and the adjusting current control circuit 12a in the second embodiment is the same as the regulator circuit 11 and the adjusting current control circuit 12 of the first embodiment so a description is omitted here.

The regulator circuit 11a and the adjusting current control circuit 12a in the second embodiment are in other words presented as one example of a variation or modification of the regulator circuit 11 and the adjusting current control circuit 12. Other detailed variations are shown as configuration rendered in the normal course of work by one skilled in the art.

Third Embodiment

Figure 16:
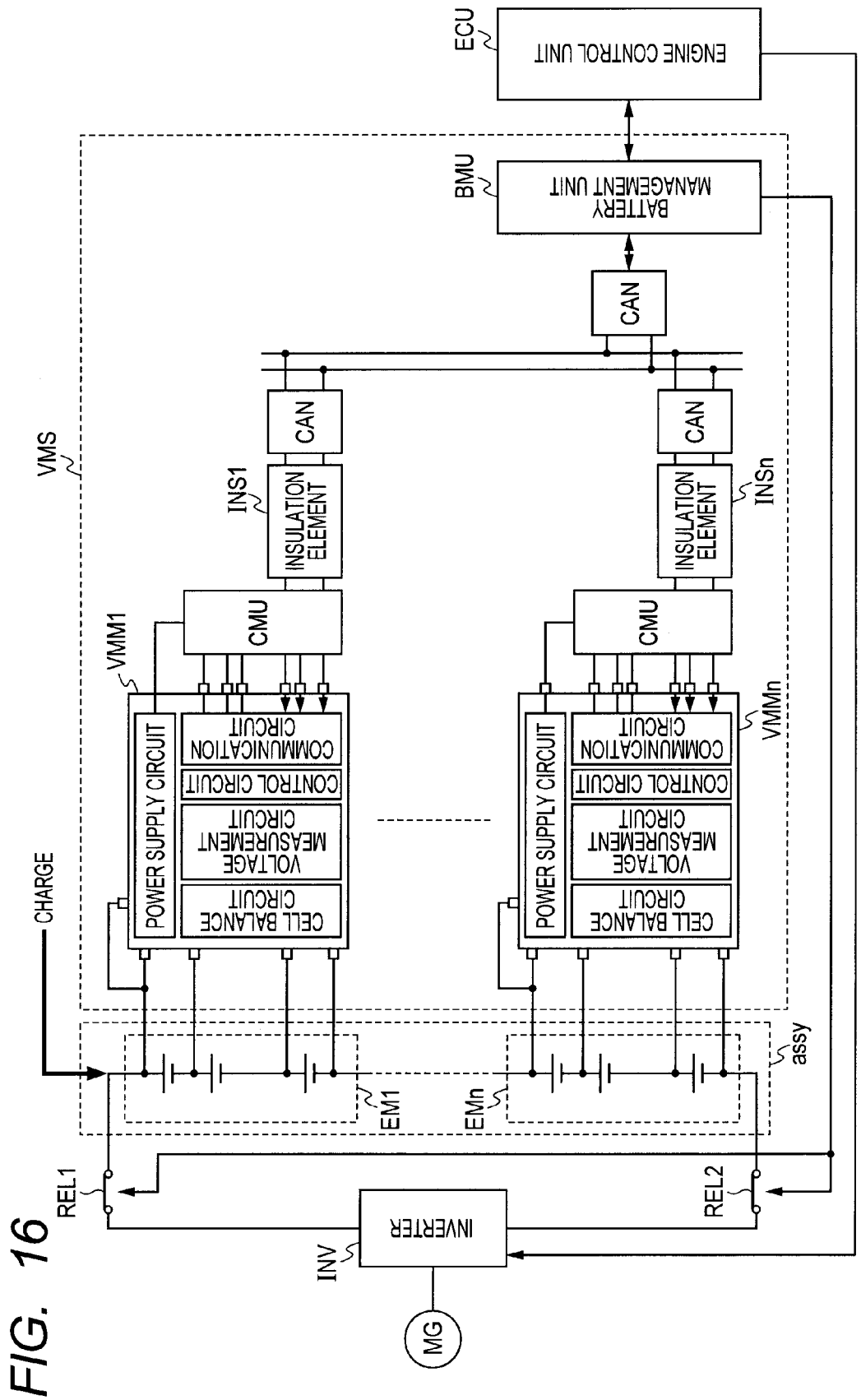
FIG. 16 is a block diagram of the motor drive circuit including the voltage monitoring system of the third embodiment.
Figure 17:
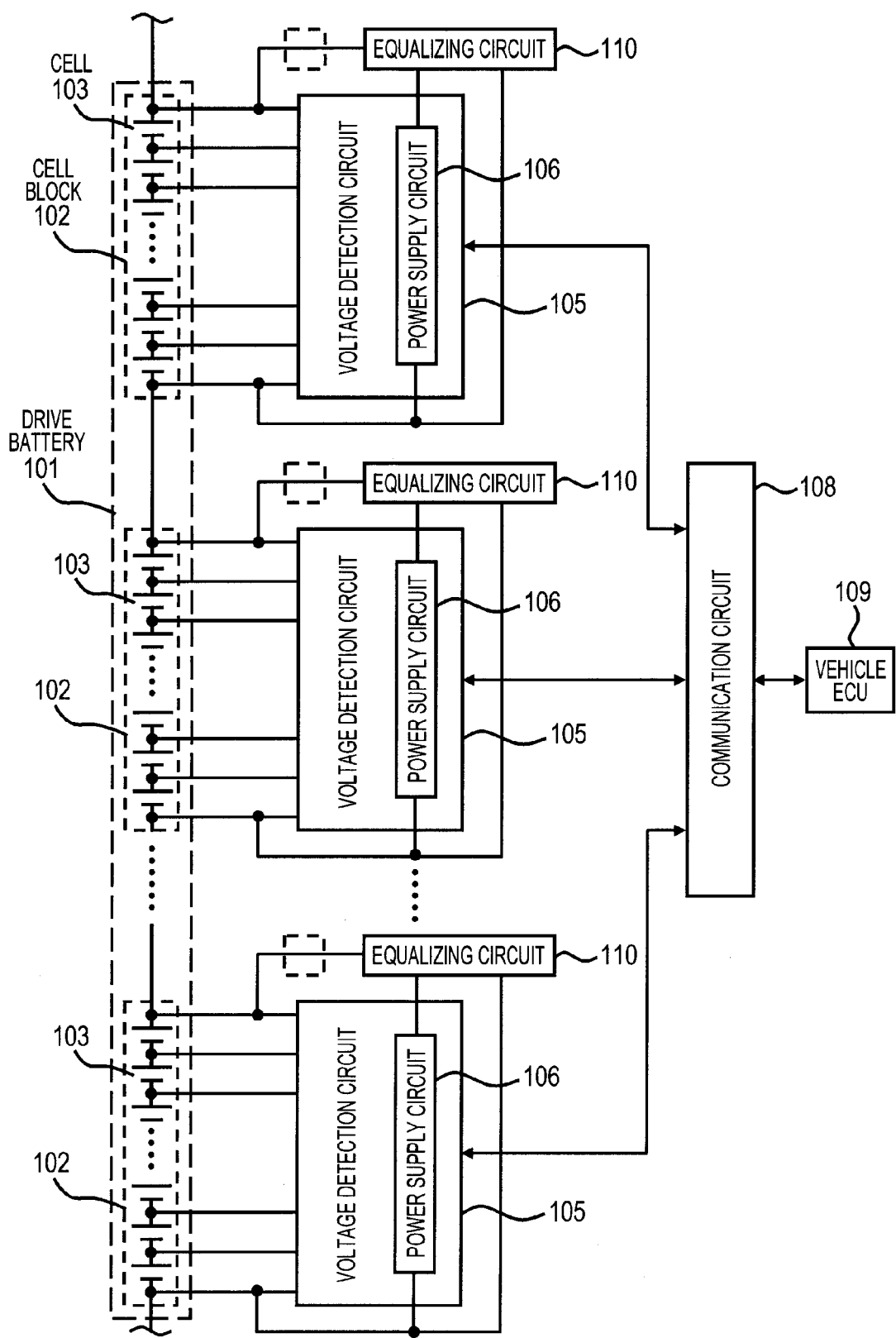
FIG. 17 is a block diagram of the vehicular power supply device described in Japanese Unexamined Patent Application Publication No. 2010-81692.

FIG. 16 is a block diagram of the voltage monitoring system of the third embodiment. In the voltage monitoring system of the third embodiment as shown in FIG. 16 one cell monitoring unit CMU is coupled to one voltage monitoring module. The cell monitoring unit CMU then communicates by way of the respective insulation elements and the CAN interface with the battery management unit BMU.

The cell monitoring unit CMU of the third embodiment is supplied with power from the power supply circuit of the voltage monitoring module, and performs readout (or loading) instructions for measurement values from the voltage monitoring modules and instructions for generating measurement values to the voltage monitoring modules. The cell monitoring unit CMU also sends data acquired from the voltage monitoring modules to the battery management unit BMU according to a request from the battery management unit BMU. The cell monitoring unit CMU of the third embodiment is equivalent to the cell monitoring unit CMU of the first embodiment except for the arithmetic processing function for acquired data. The battery management unit BMU on the other hand contains a function for arithmetic processing of acquired data that was performed by the cell monitoring unit CMU of the first embodiment.

The voltage monitoring system of the third embodiment configured as described above, includes a cell monitoring unit CMU in the load circuit supplied with a load current output by the power supply circuit of the voltage monitoring modules. In this case also, the operating current of the (plurality of) voltage monitoring modules can be equalized the same as in the other embodiments by generating an normal current code and sleep current code by the battery management unit BMU.

In the voltage monitoring system of the third embodiment, the battery management unit BMU in other words generates a normal current code. The circuit block for generating the normal current code can in other words be changed as needed in whatever circuit block where included.

The present invention is not limited by the above described embodiments and changes or modifications can be made as desired that do not depart from the scope or spirit of the invention.

What is claimed is:

1. A voltage monitoring system to monitor a plurality of battery cells mutually coupled in series, comprising:
a voltage monitoring module configured to operate on a voltage received from at least one battery cell among a plurality of battery cells and to monitor the battery cells; and
a module control circuit configured to control the voltage monitoring module,
wherein the voltage monitoring module includes:
an adjusting current control circuit that generates an adjusting current in response to a first operating current setting command sent from the module control circuit so that an operating current consumed by the voltage monitoring module reaches a specified value corresponding to the first operating current setting command and stops generating of the adjusting current in response to an operating current switching command sent from the module control circuit; and
an operating current measurement circuit that measures the operating current in response to an operating current measuring command sent following the operating current switching command,
wherein the module control circuit sends a second operating current setting command based on the measured operating current, and
wherein the adjusting current control circuit generates an adjusting current in response to the second operating current setting command so that the operating current reaches a specified value corresponding to the second operating current setting command.

2. The voltage monitoring system according to claim 1,
wherein the adjusting current control circuit generates an adjusting current so that the sum of the adjusting current and the load current consumed by circuits within the voltage monitoring module other than the adjusting current control circuit attains a specified value corresponding to the first or the second operating current setting command.

3. The voltage monitoring system according to claim 1,
wherein the adjusting current control circuit includes a variable resistor capable of switching the resistance values, selects a resistance value according to the first or second operating current setting command, and generates an adjusting current.

4. The voltage monitoring system according to claim 1 comprising:
a plurality of the voltage monitoring modules,
wherein the module control circuit obtains a current measurement value showing the size of the operating current from the respective voltage monitoring modules, and
generates the second operating current setting command corresponding to a current value larger than the current measurement value showing the largest value among the obtained current setting values.

5. The voltage monitoring system according to claim 4,
wherein the voltage monitoring modules each has a specific ID to identify itself, and
wherein the module control circuit specifies any one of the voltage monitoring modules based on the specific IDs, and sends the first operating current setting command and the second operating current setting command to each of the specified voltage monitoring modules.

6. The voltage monitoring system according to claim 1, wherein the module control circuit includes:
a timer configured to measure the elapsed time, and
wherein the module control circuit sends the operating current switching command when the time measured on the timer has reached a specified time.

7. The voltage monitoring system according to claim 1, wherein the module control circuit sends a third operating current setting command to set the operating current to a preset sleep current value after stopping the voltage monitoring operation for the battery cell voltage by the voltage monitoring module, and
wherein the adjusting current control circuit generates an adjusting current in response to the third operating current setting command so that the operating current reaches a specified value according to the third operating current setting command.

8. The voltage monitoring system according to claim 1, wherein the voltage monitoring module includes:
a communication circuit configured to communicate with the module control circuit or other voltage monitoring modules; and
a register configured to store the values specified by the first or second operating current setting command.

9. The voltage monitoring system according to claim 1, wherein the operating current includes a current consumed in other circuits installed outside of the voltage monitoring modules.

10. The voltage monitoring system according to claim 1, wherein the adjusting current control circuit includes:
a current consumption circuit configured to consume the adjusting current and to increase or decrease the adjusting current in a direction opposite the increase or decrease in the load circuit, and
a current setting circuit configured to generate a reference current to serve as a reference for the size of the operating current,
wherein the current setting circuit switches the size of the reference current according to the value shown by the first and second operating current setting commands.

11. The voltage monitoring system according to claim 1, wherein the voltage monitoring module further includes:
a regulator circuit configured to convert the voltage supplied from the battery cell and to generate an internal voltage supplied to circuits inside the voltage monitoring module.

12. The voltage monitoring system according to claim 11, wherein the regulator circuit includes:
an output transistor whose source is coupled to the power supply terminal, and whose drain is coupled to the output terminal; and
a first resistor and a second resistor coupled between the output terminal and the ground terminal,
wherein the regulator circuit generates an internal voltage by increasing or decreasing a reference voltage based on the resistance ratio of the first resistor to the second resistor,
wherein the adjusting current control circuit includes:
a current setting transistor coupled by a current mirror coupling to the output transistor; and
a current setting resistor coupled between the drain of the current setting transistor and the ground terminal,
wherein the adjusting current control circuit switches the resistance values of the current setting resistor based on values shown in the first and second operating current setting command, and generates a reference current based on the reference voltage and resistance value of the current setting resistor, and
wherein the regulator circuit increases or decreases the current flowing in the output transistor based on the reference voltage.

13. The voltage monitoring system according to claim 11, wherein the regulator circuit includes:
an output transistor whose drain is coupled to the power supply terminal and whose source is coupled to the output terminal; and
a first resister and a second resister coupled between the output terminal and the ground terminal,
wherein the regulator circuit generates an internal voltage by increasing or decreasing a reference voltage based on the resistance ratio between a first resistor and a second resistor,
wherein the adjusting current control circuit includes:
a first transistor coupled between the drain of the output transistor and the power supply terminal, and a second transistor coupled by a current mirror coupling to the first transistor; and
a current setting resistor coupled between the drain of the second transistor and the ground terminal,
wherein the adjusting current control circuit switches the resistance values of the current setting resistor based on values shown in the first and second operating current setting command, and generate a reference current based on the reference voltage and resistance value of the current setting resistor, and
wherein the regulator circuit increases or decreases the current value of the current flowing in the output transistor based on the reference current.

14. A voltage monitoring module to operate on the voltage received from at least one battery cell among a plurality of battery cells mutually coupled in series and to monitor the battery cells, the voltage monitoring module comprising:
an adjusting current control circuit that generates an adjusting current in response to a first operating current setting command sent from outside section so that the operating current consumed by the voltage monitoring module reaches a specified value corresponding to the first operating current setting command and stops generating of the adjusting current in response to an operating current switching command sent from the outside section; and
an operating current measurement circuit that measures the operating current according to the operating current measuring command sent following the operating current switching command from an outside section,
wherein the adjusting current control circuit generates an adjusting current in response to a second operating current setting command generated based on the measured operating current so that the operating current reaches a specified value corresponding to the second operating current setting command.

15. The voltage monitoring module according to claim 14, wherein the adjusting current control circuit generates an adjusting current so that the sum of the adjusting current and the load current consumed by circuits within the voltage monitoring module other than the adjusting current control circuit attains a specified value corresponding to the first or the second operating current setting command.

16. The voltage monitoring module according to claim 14, wherein the adjusting current control circuit includes a variable resistor capable of switching the resistance values, selects a resistance value according to the first and second operating current setting command, and generates an adjusting current.

17. The voltage monitoring module according to claim 14, comprising:
   a communication circuit configured to communicate with the module control circuit that controls the voltage monitoring module or other voltage monitoring modules; and
   a register configured to store the values specified by the first or second operating current setting command.

18. The voltage monitoring module according to claim 14, wherein the first and second operating current setting commands specify a current value that is the same or greater than the maximum value of operating current measured in the voltage monitoring modules.

19. The voltage monitoring module according to claim 14, wherein the size of the adjusting current is rewritten at specified intervals.

20. The voltage monitoring module according to claim 14, wherein the adjusting current control circuit includes:
   a current consumption circuit configured to consume the adjusting current and to increase or decrease the adjusting current in a direction opposite the increase or decrease in the load circuit, and
   a current setting circuit configured to generate a reference current to serve as a reference for the size of the operating current,
   wherein the current setting circuit switches the size of the reference current according to the value shown by the first and second operating current setting commands.

21. The voltage monitoring module according to claim 14, further comprising:
   a regulator circuit configured to convert the voltage supplied from the battery cell and to generate an internal voltage supplied to circuits inside the voltage monitoring module.

22. The voltage monitoring module according to claim 21, wherein the regulator circuit includes:
   an output transistor whose source is coupled to the power supply terminal, and whose drain is coupled to the output terminal; and
   a first resistor and a second resistor coupled between the output terminal and the ground terminal, and
   wherein the regulator circuit generates the internal voltage by increasing or decreasing a reference voltage based on the resistance ratio between the first resistor and the second resistor, and
   wherein the adjusting current control circuit includes:
   a current setting transistor coupled by a current mirror coupling to the output transistor; and
   a current setting resistor coupled between the drain of the current setting transistor and the ground terminal, and
   wherein the adjusting current control circuit switches the resistance values of the current setting resistor based on values shown in the first and second operating current setting command, and generates a reference current based on the reference voltage and resistance value of the current setting resistor, and
   wherein the regulator circuit increases or decreases the current flowing in the output transistor based on the reference voltage.

23. The voltage monitoring module according to claim 21, wherein the regulator circuit includes:
   an output transistor whose drain is coupled to the power supply terminal and whose source is coupled to the output terminal; and
   a first resistor and a second resistor coupled between the output terminal and the ground terminal, and
   wherein the regulator circuit generates the internal voltage by increasing or decreasing a reference voltage based on the resistance ratio between the first resistor and the second resistor, and
   wherein the adjusting current control circuit includes:
   a first transistor coupled between the drain of the output transistor and the power supply terminal, and a second transistor coupled by current mirror coupling to the first transistor; and
   a current setting resistor coupled between the drain of the second transistor and the ground terminal, and
   wherein the adjusting current control circuit switches the resistance values of the current setting resistor based on values shown in the first and second operating current setting command, and generates a reference current based on the reference voltage and resistance value of the current setting resistor, and
   wherein the regulator circuit increases or decreases the current value of the current flowing in the output transistor based on the reference current.

* * * * *